(12) United States Patent
Fujieda

(10) Patent No.: US 6,377,100 B1
(45) Date of Patent: Apr. 23, 2002

(54) SEMICONDUCTOR DEVICE

(75) Inventor: Waichiro Fujieda, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/605,057

(22) Filed: Jun. 28, 2000

(30) Foreign Application Priority Data

Jul. 23, 1999 (JP) .......................................... 11-209962

(51) Int. Cl.$^7$ .............................................. H03H 11/26
(52) U.S. Cl. ...................................... 327/262; 327/158
(58) Field of Search ................................. 327/149, 153, 327/158, 262, 264, 276, 278, 281, 288, 161

(56) References Cited

U.S. PATENT DOCUMENTS 5,973,525 A  * 10/1999  Fujii ........................... 327/158
6,049,233 A  *  4/2000  Shurboff ...................... 327/149
6,137,328 A  * 10/2000  Sung .......................... 327/161
6,140,854 A  * 10/2000  Coddington .................. 327/149
6,194,930 B1 *  2/2001  Matsuzaki et al. ............ 327/161

* cited by examiner

*Primary Examiner*—Kenneth B. Wells
*Assistant Examiner*—Linh Nguyen
(74) *Attorney, Agent, or Firm*—Arent Fox Kintner Plotkin & Kahn, PLLC

(57) ABSTRACT

A semiconductor device, comprising a stabilized timing circuit for regulating the phase of each of first and second clocks complementary with each other input from an external source and generating each of first and second internal clocks delayed by a predetermined phase, is disclosed. The stabilized timing circuit includes a clock input circuit unit for receiving the first and second clocks complementary with each other, and a dummy input circuit unit for receiving a first feedback clock and a second feedback clock complementary with each other and having the delay time equivalent to the delay time of the first and second clocks in the clock input circuit unit.

5 Claims, 13 Drawing Sheets

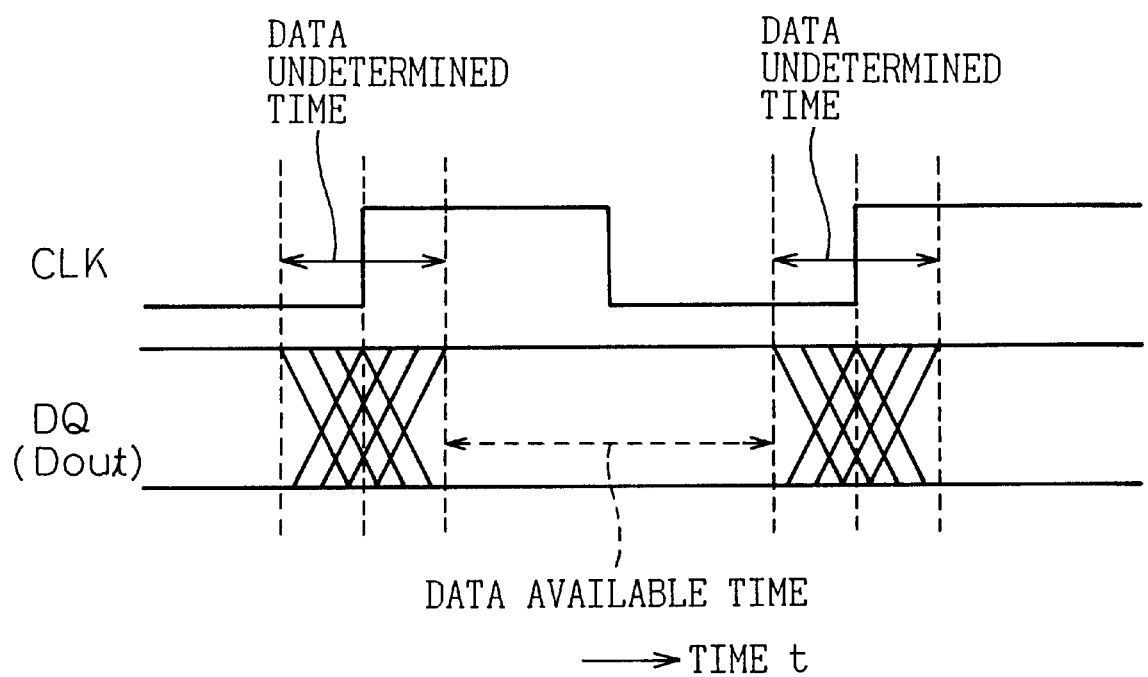

SEMICONDUCTOR DEVICE

BACKGROUND OF THE INVENTION

1. Field of the Invention

The present invention relates to a semiconductor device comprising a stabilized timing circuit (STC), such as a delayed locked loop (DLL), for regulating the phase of two external clocks constituting complementary clocks input from an external source and generating internal clocks having a predetermined phase relationship with the two external clocks. More specifically, the present invention relates to a synchronous dynamic random access memory (hereinafter, abbreviated to SDRAM) for generating internal clocks delayed by a predetermined phase from external clocks supplied from an external source in a complementary clock form (i.e. differential clock form) regardless of the fluctuations of the ambient temperature, the source voltage, and the like.

In recent years, a higher speed of the SDRAM has been required with an increase in a speed of a CPU (central processing unit). In order to meet this requirement, a sufficient data window representing the data available time is required to be secured while reducing the clock cycle time. For this purpose, it is necessary to accurately control the timing of the data output and to secure a sufficient margin to retrieve the address and data by using an STC such as a DLL circuit.

2. Description of the Related Art

Generally, in an SDRAM operating at high speed, it is necessary that data are always input and output correctly and in a predetermined accurate phase relationship (for example, at 360° corresponding to one period of the clock, or in another phase relationship) with an external clock input from an external source. Usually, therefore, the SDRAM includes a DLL circuit or the like to accurately regulate the phase difference between the clock input from an external source and an internal clock and to generate the internal clock, so that the external clock input to the DLL circuit is apparently in phase with the data output from the SDRAM.

The data is input to and output from the SDRAM, according to the related art, in synchronism with the leading (or trailing) edge of the external clock and, therefore, the maximum frequency of the data is limited to the same frequency as the external clock. To address this disadvantage, a technique (e.g., DDR (double data rate)) has been developed, in which a data signal is input and output in synchronism with both the leading edge of a first clock input from an external source and the leading edge of a second clock complementary with the first clock (i.e., second clock which is out of phase with the first clock by 180°). In other words, the data can be input and output at a transfer rate twice as high as the case in which only one of the edges of the clocks is used. For this purpose, a DLL circuit has been proposed which is supplied with first and second clocks complementary with each other and generates first and second internal clocks in phase with the first and second clocks, respectively, that is to say, which operates in the complementary clock form.

To facilitate understanding of the problem concerning a conventional STC such as an ordinary DLL circuit operating in the complementary clock form, the configuration of a clock circuit according to the related art will be explained with reference to FIG. 1 described later in "BRIEF DESCRIPTION OF THE DRAWINGS".

A configuration of the STC according to the related art, operating in the complementary clock form for outputting complementary internal clocks, is illustrated in FIG. 1. As shown in FIG. 1, a STC 100 is typically configured with a DLL circuit for outputting first and second internal clocks complementary with each other in phase with the leading edge of two external clocks (a first clock CLK and a second clock /CLK) complementary with each other. By way of explanation, each of the external clocks will be referred to merely as "clock".

The DLL circuit shown in FIG. 1 includes a clock input circuit unit 200 supplied with two external clocks complementary with each other (for example, a first clock CLK and a second clock /CLK which is out of phase with the first clock CLK by 180°). The clock input circuit unit 200 in turn includes a first input first stage circuit unit 200a and a second input first stage circuit unit 200b for generating two input clocks complementary with each other (for example, a first input clock clkz and a second input clock clkbz which is out of phase with the first input clock clkz by 180°) based on the first clock CLK and the second clock /CLK, respectively.

Further, the DLL circuit shown in FIG. 1 includes a first delay element circuit unit 300a and a second delay element circuit unit 300b for delaying, by a predetermined phase, the two input clocks clkz, clkbz supplied from the first input first stage circuit unit 200a and the second input first stage circuit unit 200b, respectively; and a delay element control circuit unit 400 for setting a delay amount (delay time) corresponding to the delay of a predetermined phase from the external clocks by controlling the number of delay stages of the first and second delay element circuit units 300a, 300b.

Further, the DLL circuit shown in FIG. 1 includes a frequency divider 800 for generating a reference clock refclk by dividing the frequency of the first input clock clkz; and a phase comparing unit 900 for comparing the phase of the reference clock refclk supplied from the frequency divider 800 with the phase of the dummy clock dumclk3 output from a dummy circuit 600 described later. The delay element control circuit unit 400 sets the delay amount of the first and second delay element circuit units 300a, 300b (and a dummy delay element circuit unit 630 described later) based on a phase difference signal pcclk obtained as the result of phase comparison, by the phase comparing unit 900, between the reference clock refclk and the dummy clock dumclk3.

Further, the DLL circuit shown in FIG. 1 includes an output circuit unit 500 for retrieving the data DATA at the leading edge of each of the two internal clocks (for example, the first internal clock clkd and the second internal clock clkbd) output from the first and second delay element circuit units 300a, 300b, respectively, and outputting the data DATA as output data (output signal Dout). The delay time is regulated by the first and second delay element circuit units 300a, 300b in such a manner as to output the data from the data (output signal Dout) from the output circuit unit 500 in synchronism with the leading edge of the external clocks (CLK, /CLK) regardless of the fluctuations of the ambient temperature and the source voltage.

Further, the DLL circuit shown in FIG. 1 includes a dummy circuit 600 for monitoring the time in which the external clocks pass through the clock input circuit unit 200 and the time in which the internal clocks pass through the output circuit unit 500, in order to accurately set the delay amount corresponding to the phase delay of the internal clocks with respect to the external clocks. The dummy circuit 600 is configured with a dummy delay element circuit unit 630 which is set to have the same delay amount as each of the first and second delay element circuit units 300a, 300b by means of the delay element control circuit unit 400; a dummy input circuit unit 640 having the same delay amount as the clock input circuit unit 200; and a dummy output circuit unit 650 having the same delay amount as the output circuit unit 500.

The dummy clock dmuclk1 output from the dummy delay element circuit unit 630 is output as a dummy clock dumclk2 delayed by the delay amount of the output circuit unit 500 by the dummy output circuit unit 650, and further delayed into a dummy clock dumclk3 by the delay amount of the clock input circuit 640 by the dummy input circuit unit 640. The dummy clock dumclk3 corrected in this way is input to one of the input portions of the phase comparing unit 900. On the other hand, the frequency of the first input clock clkz supplied from the first input first stage circuit unit 200 is divided by the frequency divider 800 and input to the dummy delay element circuit unit 630 as an input dummy clock dumclk0 while at the same time being input to the remaining one of the input portions of the phase comparing unit 900 as a reference clock refclk in an opposite phase to the input dummy clock dumclk0.

In the DLL circuit of FIG. 1, by activating the delay element control circuit unit 400 in accordance with the result of phase comparison in the phase comparing unit 900, the delay amount of the first and second delay element circuit units 300*a*, 300*b* and the dummy delay circuit unit 630 is changed in such a way that the phase difference is zero between the reference clock refclk and the dummy clock dumclk3. When the phase difference between the reference clock refclk and the dummy clock dumclk3 becomes zero, the phase comparing unit 900 is locked up with the final result that the data DATA is output in synchronism with the leading edge of each of the first and second clocks.

It should be noted, however, that the input signal is input to the dummy input circuit unit 640 of the dummy circuit 600 and this is different from the way in which the input signal is input to the clock input circuit unit 200. More specifically, the complementary clocks CLK, /CLK are input to the input terminals of the first input first stage circuit unit 200*a* and the second input first stage circuit unit 200*b*, respectively, while the dummy clock dumclk2 is input to one of the two input terminals of the dummy input circuit unit 640 and the reference signal Vref is input to the remaining one of the input terminals of the dummy input circuit unit 640.

As described above, the first input first stage circuit unit 220*a* and the second input first stage circuit unit 200*b* and the dummy input circuit 640 have substantially the same circuit configuration in order to obtain the same delay time.

In the DLL circuit according to the related art described above, however, the reference signal of DC level is input to one of the input terminals of the dummy input circuit unit, instead of the clock signal, and therefore, an error occurs between the time in which the clock passes through the clock input circuit unit and the time in which the dummy clock passes through the dummy input circuit unit. This error shifts the leading edges of the two clock signals input to the phase comparing unit 900, thereby causing the problem in that the timing of outputting the data is shifted with respect to the external clock. In such a case, the data available time is likely to be substantially reduced depending on the method in which the data available time is defined.

SUMMARY OF THE INVENTION

The present invention has been developed in view of the aforementioned problem, and the object thereof is to provide a semiconductor device comprising a stabilized timing circuit (STC), such as a DLL circuit supplied with complementary clocks, wherein an error concerning the time in which the clocks pass through the whole dummy circuit is reduced to minimum and the data available time, defined concerning the data output in synchronism with the clock, can be secured in a time length as long as possible.

In order to accomplish the object described above, according to the present invention, there is provided a semiconductor device comprising a stabilized timing circuit supplied with a first clock and a second clock, complementary with each other, for generating a first internal clock and a second internal clock having a predetermined phase relationship with the first clock and the second clock, respectively, wherein the stabilized timing circuit includes a clock input circuit unit supplied with the first and second clocks, and a dummy input circuit unit supplied with a first feedback clock and a second feedback clock complementary with each other and having a delay time equivalent to the delay time of the first and second clocks in the clock input circuit unit.

Preferably, the stabilized timing circuit further includes a first dummy output circuit unit for generating the first feedback clock in response to a single-phase feedback clock generated by regulating the phase of the first clock or the second clock, and a second dummy output circuit unit for generating the second feedback clock in response to the single-phase feedback clock.

In other words, in a semiconductor integrated circuit comprising a stabilized timing circuit operating in response to complementary clocks according to the present invention, an opposite phase signal (i.e., the second feedback clock) which is opposite in phase to the first feedback clock (dummy clock dumclk2 in FIG. 1) is generated and input to the dummy input circuit unit in place of the reference signal of DC level, in order to more accurately monitor the time in which the first and second clocks pass through the input circuit unit of the stabilized timing circuit.

In summary, according to the present invention, the first and second feedback clocks are input to the dummy input circuit unit in the same input condition (i.e. in a complementary clock form) as the input first stage circuit unit of the stabilized timing circuit, and therefore, an error concerning the monitor time of the dummy circuit as a whole can be reduced as compared with the case in which the reference signal of DC level is used as in the related art.

BRIEF DESCRIPTION OF THE DRAWINGS

The above object and features of the present invention will be more apparent from the following description of the preferred embodiments with reference to the accompanying drawings, wherein:

FIG. 13 is a timing chart showing the relationship between clocks and output data according to the embodiment of FIG. 2.

DESCRIPTION OF THE PREFERRED EMBODIMENTS

A preferred embodiment of the present invention will be explained below with reference to the accompanying drawings including FIGS. 2 and 3.

Figure 2:
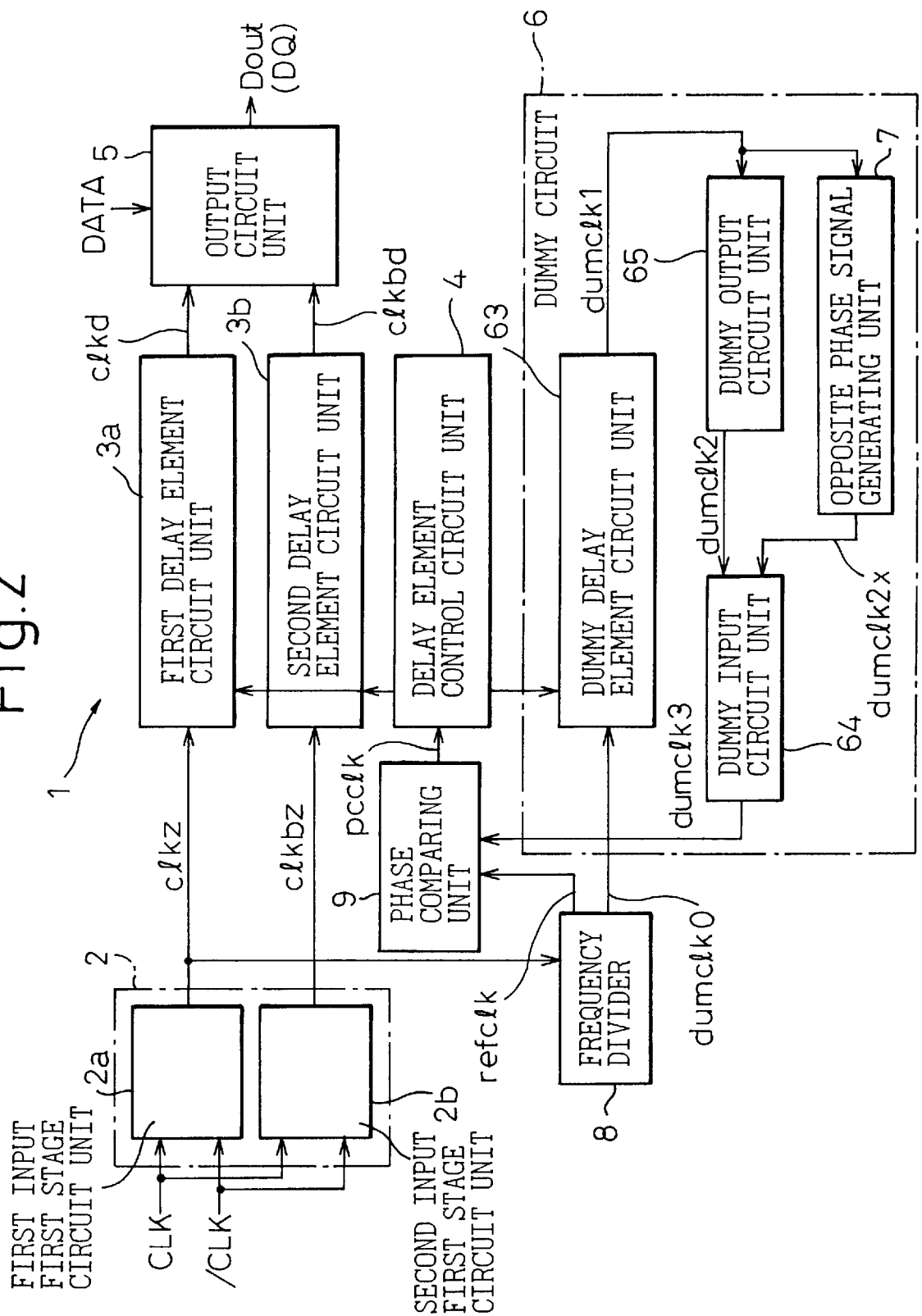
FIG. 2 is a block diagram showing a configuration according to a preferred embodiment of the present invention.

FIG. 2 is a block diagram showing a configuration according to a preferred embodiment of the present invention. This configuration includes a stabilized timing circuit 1 and an output circuit unit 5 operating with complementary clocks for outputting data. Hereinafter in this specification, similar component elements to those described above will be designated by the same reference numerals, respectively.

The stabilized timing circuit 1 of FIG. 2 is configured with a DLL circuit having the function of regulating the phase of first and second clocks CLK, /CLK input in a complementary relationship to each other in order to output data in synchronism with the leading edges of two external clocks complementary with each other (i.e., the first clock CLK and the second clock /CLK which is out of phase with the first clock CLK by 180°).

The stabilized timing circuit 1 or, preferably, the DLL circuit shown in FIG. 2 includes a clock input circuit unit 2 supplied with the first and second clocks CLK, /CLK complementary with each other from an external source. In the first input first stage circuit unit 2a and the second input first stage circuit unit 2b of the clock input circuit unit 2, two input clocks complementary with each other (i.e., a first input clock clkz and a second input clock clkbz which is out of phase with the first input clock clkz by 180°) are generated based on the first clock CLK and the second clock /CLK. The clock input circuit unit 2 has a similar configuration to the clock input circuit unit 200 according to the related art described above.

Further, the DLL circuit shown in FIG. 2 includes a first delay element circuit unit 3a and a second delay element circuit unit 3b for delaying the two input clocks clkz, clkbz supplied from the first input first circuit unit 2a and the second input first stage circuit unit 2b, respectively, by a predetermined phase (for example, 360° corresponding to one clock period), and a delay element control circuit unit 4 for setting a delay amount (delay time) corresponding to a predetermined phase delay for the first and second clocks CLK, /CLK by controlling the number of delay stages of the first and second delay element circuit units 3a, 3b.

Further, the DLL circuit of FIG. 2 includes a frequency divider 8 for generating a reference clock refclk by dividing the frequency of the first input clock clkz, and a phase comparing unit 9 for comparing the phase of the reference clock refclk supplied from the frequency divider 8 with the phase of the dummy clock dumclk3 output from the dummy circuit 6 described later. This phase comparing unit 9 compares the phase of the reference clock refclk with the phase of the dummy clock dumclk3 and outputs the phase difference between the two clocks as a phase difference signal pcclk. The delay element control circuit unit 4 sets the delay amount of the first and second delay element circuit units 3a, 3b (and the dummy delay circuit unit 63 described later) based on the phase difference signal pcclk output from the phase comparing unit 9. The first delay element circuit unit 3a, the second delay element circuit unit 3b, the delay element control circuit unit 4, the frequency divider 8 and the phase comparing unit 9 have substantially the same configuration as the first delay element circuit unit 300a, the second delay element circuit unit 300b, the delay element control circuit unit 400, the frequency divider 800 and the phase comparing unit 900, respectively, according to the related art described above (FIG. 1).

The configuration in FIG. 2 further includes an output circuit unit 5 for retrieving the data DATA by utilizing the leading edge of each of the two internal clocks (for example, the first internal clock clkd and the second internal clock clkbd) supplied from the first and second delay element circuit units 3a, 3b, respectively. The data DATA retrieved by the output circuit unit 5 is output to a circuit external to the DLL circuit as an output signal Dout (i.e. the output data DQ). In the case in which each of the first and second internal clocks clkd, clkbd has a phase delay of an amount which is equivalent to the value obtained by subtracting the delay time in the output circuit unit from 360°, with respect to the two external clocks CLK, /CLK, the DLL circuit operating with complementary clocks outputs the data (Dout), in synchronism with the leading edge of each of the two external clocks (i.e., at the same frequency as that of the external clock). The output circuit unit 5 has substantially the same configuration as the output circuit unit 500 according to the related art described above (FIG. 1).

Further, the DLL circuit shown in FIG. 2 includes a dummy circuit 6 for monitoring the time in which the first and second clocks CLK, /CLK pass through the clock input circuit unit 2 and the time in which the first and second internal clocks clkd, clkbd pass through the output circuit unit 5.

This dummy circuit 6 has the function of accurately setting the delay amount corresponding to the time delay of the first and second clocks CLK, /CLK, i.e., the phase delay of the internal clocks with respect to the external clocks regardless of fluctuations of the ambient temperature or the source voltage. More specifically, the dummy circuit 6 includes a dummy delay element circuit unit 63 which is set to have the same delay amount as the first and second delay element circuit units 3a, 3b by the delay element control circuit unit 63, a dummy output circuit unit 65 having the same delay amount as the output circuit unit 5, and a dummy input circuit unit 64 having the same delay amount as the clock input circuit unit 2 (especially, the first input first stage circuit unit 2a and the second input first stage circuit unit 2b). Further, an opposite phase signal generating unit 7 for generating an opposite phase signal having an opposite phase to the dummy clock dumclk2 (i.e. the opposite phase dummy clock dumclk2x) output from the dummy output circuit unit 65 is disposed in the input portion of the dummy input circuit unit 64. The dummy output circuit unit 65 and the opposite phase signal generating unit 7 constitute a first dummy output circuit unit and a second dummy output circuit unit, respectively, according to the present invention.

More specifically, the dummy clock dumclk1 output from the dummy delay element circuit unit 63 (i.e., the single-phase feedback clock generated by phase regulation of the first clock) is delayed by the same amount as the delay in the output circuit unit 2 of the real circuit by the dummy output circuit unit 65 and output as a dummy clock dumclk2. Further, the dummy clock dumclk2 output from the dummy output circuit unit 65 is supplied to one of the input portions of the dummy input circuit unit 64 on the one hand and the dumclk2x output from the opposite phase signal generating unit 7 is supplied as an opposite phase signal to the remaining one of the input portions of the dummy input circuit unit 64 at the same time.

In other words, the input portions of the dummy input circuit unit 64 in the dummy circuit, like the input portion of the first input first stage circuit unit 2a and the second input first stage circuit unit 2b in the real circuit, are supplied with the dummy clock dumclk2 and the opposite phase dummy clock dumclk2x in a complementary clock form. The dummy clock dumclk2 and the opposite phase dummy clock dumclk2x correspond to the first feedback clock and the second feedback clock, respectively, according to the present invention.

Further, the dummy input circuit unit 64 outputs the dummy clock dumclk3 delayed by the same amount as the delay of each of the first input first stage circuit unit 2a and the second input first stage circuit unit 2b. With this configuration, the opposite phase signal generated in the opposite phase signal generating unit 7 is input to the dummy input circuit unit 64, in place of the reference signal Vref of DC level (FIG. 1), so that the two dummy clocks (first and second feedback clocks) complementary with each other are input to the dummy input circuit unit 64 in a complementary clock form, and therefore, an error between the time in which the clock passes through the clock input circuit unit and the time in which the dummy clock passes through the dummy input circuit unit can be reduced to a relatively small amount.

The dummy clock dumclk3 output from the dummy input circuit unit 64 is input to one of the input portions of the phase comparing unit 9. On the other hand, the frequency of the first input clock clkz supplied from the first input first stage circuit unit 2 is divided by the frequency divider 8, and input to the dummy delay element circuit unit 63 as an input dummy clock dumclk0 and also input to the remaining one of the input portions of the phase comparing unit 9 as a reference clock refclk on the other hand. As a result, the period of the dummy clock dumclk1 output from the dummy delay element circuit unit 63 coincides with the period of the clock divided by the frequency divider 8, i.e., the period of the reference clock refclk. In this way, a phase comparison can be accurately carried out between the reference clock refclk and the dummy clock dumclk1 at the period of the frequency-divided clock. In this phase comparison, the leading edge of the reference clock refclk is compared with the leading edge of the dummy clock dumclk3 thereby to determine the phase difference between the reference clock refclk and the dummy clock dumclk3.

In the DLL circuit shown in FIG. 2, the delay element control circuit unit 4 is operated in accordance with the result of phase comparison in the phase comparing unit 9, so that the delay amount of the first and second delay element circuit units 3a, 3b and the dummy delay circuit unit 63 is changed in such a way as to attain a phase difference of zero between the reference clock refclk and the dummy clock dumclk3. When the phase difference between the reference clock refclk and the dummy clock dumclk3 has become zero, the phase comparing unit 9 is locked up (i.e., the DLL circuit is locked up), and the data (Dout) is finally output in synchronism with the leading edge of each of the first and second clocks CLK, /CLK.

According to the embodiment shown in FIG. 2, the clock is input to the dummy input circuit unit in the same complementary clock form as the input first stage circuit unit in the stabilized timing circuit such as the DLL circuit. Therefore, an error between the time in which the clock passes through the input first stage circuit unit and the time in which the dummy clock passes through the dummy input circuit unit is reduced as compared with the related art which uses the reference signal of DC level, thereby reducing an error concerning the monitor time of the dummy circuit as a whole.

Concrete circuit configurations according to an embodiment of the present invention will be explained with reference to FIGS. 3(A) to 8.

Figure 1:
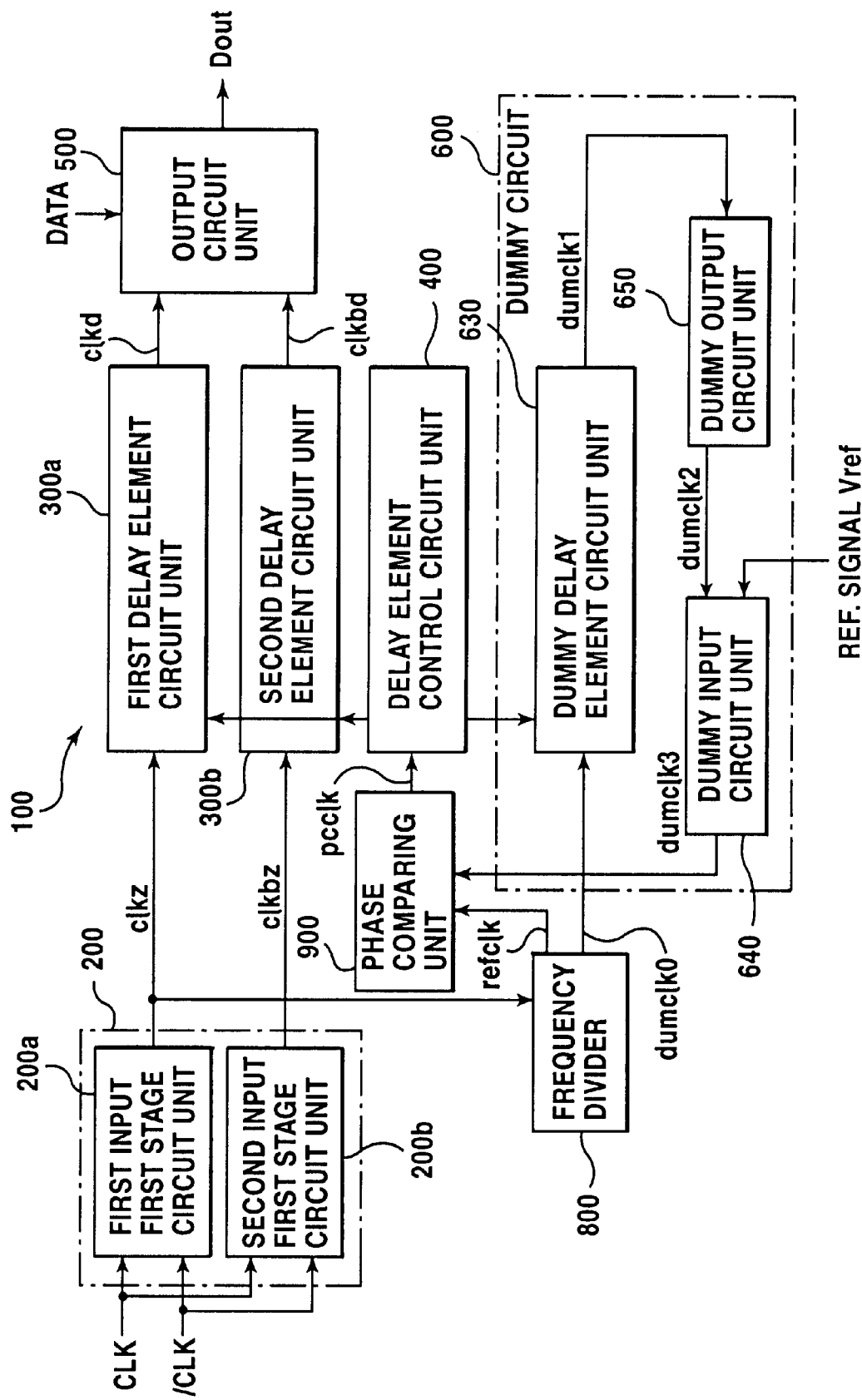
FIG. 1 is a block diagram showing a configuration of a stabilized timing circuit according to the related art.
Figure 3A:
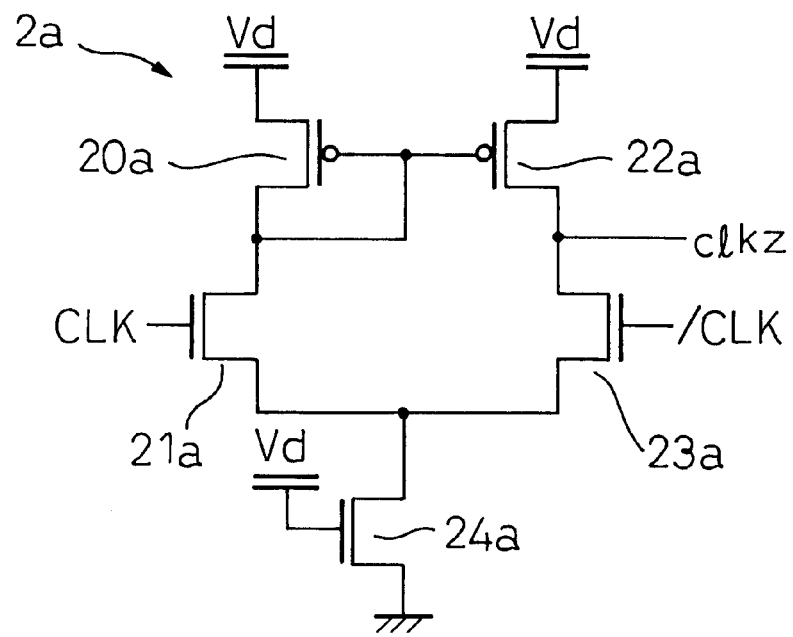
FIGS. 3(A) and 3(B) are circuit diagrams showing a concrete configuration of an input first stage circuit unit according to the embodiment of FIG. 2.
Figure 3B:
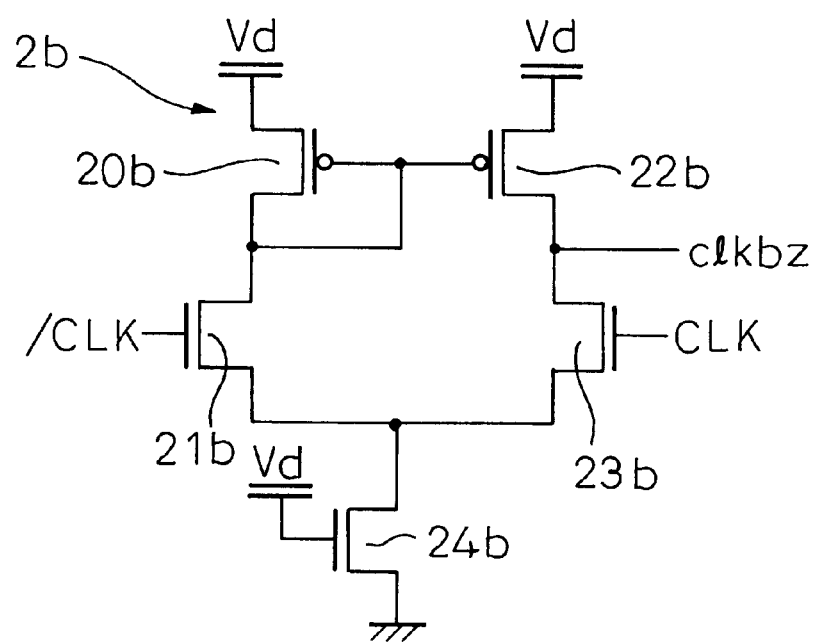

FIGS. 3(A) and 3(B) are circuit diagrams showing a concrete configuration of the input first stage circuit unit according to the embodiment shown in FIG. 1. Each of the first input first stage circuit unit 2a and the second input first stage circuit unit 2b shown in FIG. 2 has a current mirror circuit. The first input clock clkz and the second input clock clkbz which is out of phase with the first input clock clkz by 180° are generated based on the first clock CLK and the second clock /CLK input in a complementary clock form.

More specifically, the first input first stage circuit unit 2a shown in FIG. 3(A) includes a pair of nMOS transistors 21a, 23a functioning as a differential amplifier, an nMOS transistor 24a functioning as a current source for the whole circuit, and a pair of pMOS transistors 20a, 22a (these transistors constitute a current mirror circuit) connected in a current mirror circuit form for regulating the current flowing in the nMOS transistor 23a included in the nMOS transistor pair 21a, 23a. Further, the source of each of the pMOS transistors 20a, 22a constituting the current mirror circuit is connected to the high-voltage power supply of the source voltage Vd, and the drains of the pMOS transistors 20a, 22a are connected to the drains of the nMOS transistors 21a, 23a, respectively. Further, the source of each of the nMOS transistors 21a, 23a is connected to the drain of the nMOS transistor 24a of the current source. The source of the nMOS transistor 24a, on the other hand, is connected to the low-voltage power supply of the ground potential or the like.

In the first input first stage circuit unit 2a of FIG. 3(A), the first clock CLK is input to the gate of the nMOS transistor 21a included in the nMOS transistor pair 21a, 23a, while the second clock /CLK having an opposite phase to the first clock is input to the gate of the nMOS transistor 23a. The first clock CLK input to the gate of the nMOS transistor 21a is stabilized by the nMOS transistors 20a, 22a constituting the current mirror circuit, and output from the drain of the nMOS transistor 23a as the first input clock clkz having a predetermined phase delay behind the first clock CLK.

The second input first stage circuit unit 2b of FIG. 3(B), on the other hand, includes a pair of nMOS transistors 21b, 23b functioning as a differential amplifier, an nMOS transistor 24b functioning as a current source for the whole circuit, and a pair of pMOS transistors 20b, 22b (these transistors also constitute a current mirror circuit, as in the pMOS transistors 20a, 22a described above) connected in a current mirror circuit form for regulating the current flowing in the nMOS transistor 23b included in the nMOS transistor pair 21b, 23b. Further, the source of each of the pMOS transistors 20b, 22b constituting the current mirror circuit is connected to the high-voltage power supply of the source voltage Vd, and the drains of the pMOS transistors 20b, 22b are connected to the drains of the nMOS transistors 21b, 23b, respectively. Further, each of the sources of the nMOS transistors 21b, 23b is connected to the drain of the nMOS transistor 24b of the current source. The source of the nMOS transistor 24b, on the other hand, is connected to the low-voltage power supply of the ground potential or the like.

In the second input first stage circuit unit 2b shown in FIG. 3(B), the second clock /CLK is input to the gate of the nMOS transistor 21b included in the nMOS transistor pair 21b, 23b on the one hand and the first clock CLK is input to the gate of the nMOS transistor 23b included in the nMOS transistor pair 21b, 23b on the other hand. The second clock /CLK input to the gate of the nMOS transistor 21b is stabilized by a pair of pMOS transistors 20b, 22b constituting a current mirror circuit, and output from the drain of the nMOS transistor 23b as a second input clock clkbz having a predetermined phase delay behind the second clock /CLK.

The first input clock clkz and the second input clock clkbz in opposite phase to the first input clock clkz, are stably generated by the first input first stage circuit unit 2a and the second input first stage circuit unit 2b including a current mirror circuit as shown in FIGS. 3(A) and 3(B).

Figure 4:
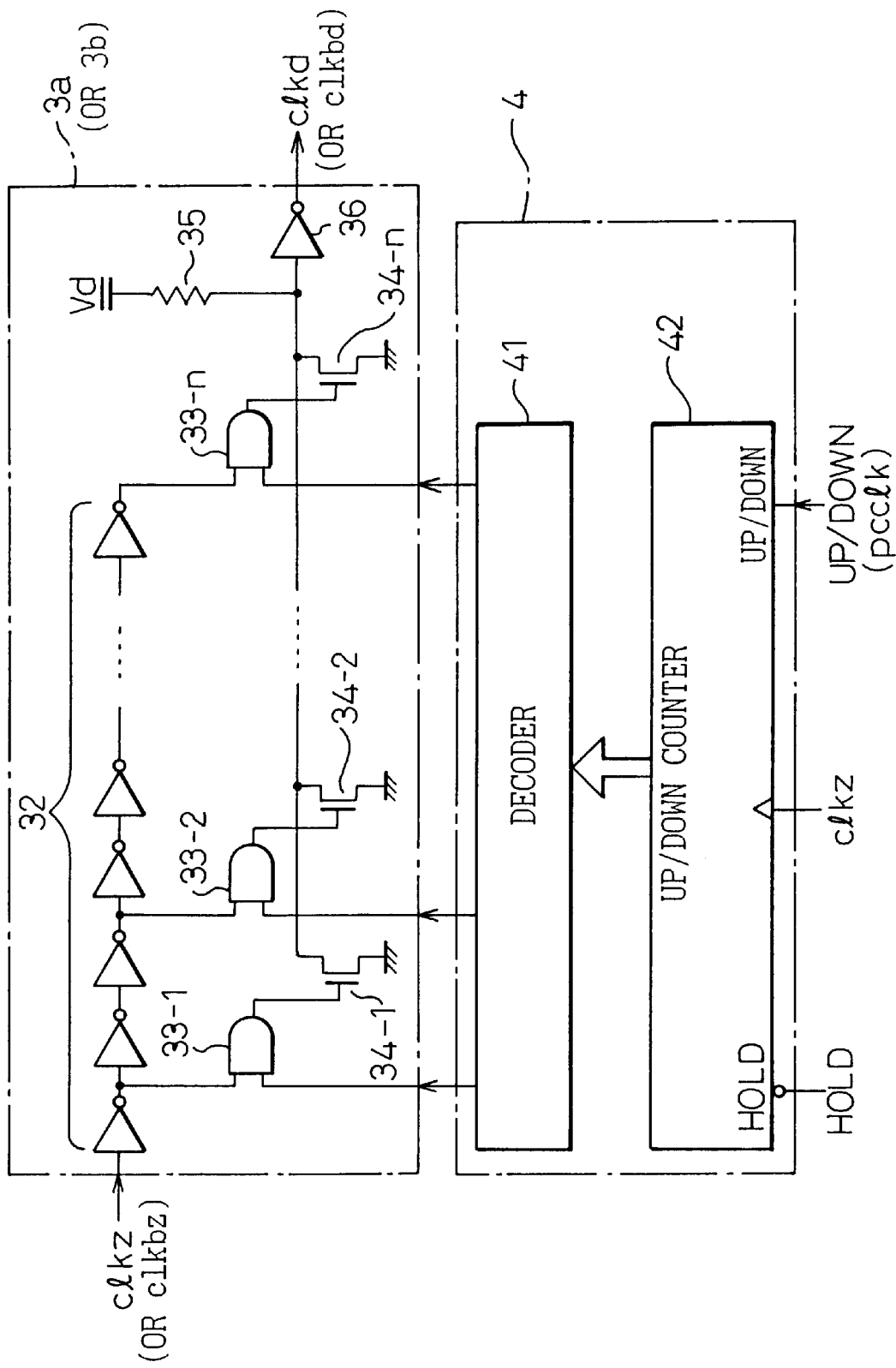
FIG. 4 is a circuit diagram showing a concrete configuration of a delay element circuit unit and a delay element control circuit unit according to the embodiment of FIG. 2.

FIG. 4 is a circuit diagram showing a concrete configuration of the delay element circuit unit and the delay element control circuit unit according to the embodiment of FIG. 1. In FIG. 4, only one of the first delay element circuit unit 3a (FIG. 2) and the second delay element circuit unit 3b (FIG. 2) is shown, while the other delay element circuit unit is not shown. The first delay element circuit unit 3a and the second delay element circuit unit 3b have the same circuit configuration, and are regulated to the same delay amount by the control signal from the delay element control circuit unit 4 (FIG. 2).

As shown in FIG. 4, the first delay element circuit unit 3a (or the second delay element circuit unit 3b) comprises an invertor group 32 including a plurality of invertors in series with each other, an AND gate group including a plurality of AND gates 33-1 to 33-n (n; arbitrary positive integer not less than 2) each having one of the input terminals arranged in such a way as to receive the output signal from each two stages of the invertor group 32, and a transistor group including nMOS transistors 34-1 to 34-n having the gates thereof supplied with the output signals of the AND gate group, respectively. The drains of the nMOS transistors 34-1 to 34-n are connected to a common signal line, and also connected to the high-voltage power supply of the source voltage Vd through a resistor 35. The sources of the nMOS transistors 34-1 to 34-n, on the other hand, are connected to the low-voltage power supply of the ground potential or the like.

Further, the first delay element circuit unit 3a (or the second delay element circuit unit 3b) includes a buffer 36 having an input terminal connected to the aforementioned signal line. The buffer 36 outputs a first internal clock clkd (or a second internal clock clkbd) having the phase delay corresponding to a predetermined delay amount with respect to the first input clock clkz (or the second input clock clkbz).

The delay element control circuit unit 4 shown in FIG. 4 includes an up/down counter 42 for switching a count-up operation and a count-down operation in accordance with the result of a phase comparison in the phase comparing unit 9 (FIG. 2), and a decoder 41 for decoding an output signal of the up/down counter 42. The up/down counter 42 can hold the count value by setting the hold signal HOLD to "L" (low) level whenever required. In the case in which the hold signal HOLD is maintained at "H" (high) level, either the count-up operation or the count-down operation is carried out in accordance with the up/down signal UP/DOWN (corresponding to the phase difference signal pcclk shown in FIG. 2) output based on the result of a phase comparison in the phase comparing unit 9 with the timing of the rise of the first input clock clkz.

The decoder 41 sets the output signal of one of the output terminals to "H" level and the output signal of the remaining one of the output terminals to "L" level in accordance with the output signal of the up/down counter 42. In the case in which the up/down counter 42 carries out the count-up operation, the position of the output terminal set to "H" level is shifted rightward, while when the count-down operation is carried out, the position of the output terminal set to "H" level is shifted leftward. A plurality of the terminals of the decoder 41 are connected sequentially to the remaining ones of the input terminals of the AND gates 33-1 to 33-n, respectively, so as to activate only the AND gate supplied with the "H" level output signal from the decoder 41. Further, among the output signals of the invertor group 32, the output signal input to the activated AND gate is output as the first internal clock clkd. Thus, depending on which AND gate is activated, the number of stages in the invertor group through which the first internal clock passes changes. Thus, the delay amount of the first internal clock clkd can be selected appropriately.

As described above, the delay amount of the first delay element circuit unit 3a and the second delay element circuit unit 3b can be set in steps under the control of the delay element control circuit unit 4. In addition, the first delay element circuit unit 3a and the second delay element circuit unit 3b have the same delay amount. The phase comparing unit 9 compares the first input clock clkz (actually, the frequency-divided reference clock refclk) input to the first delay element circuit unit 3a with the output signal (actually, the frequency-divided dummy clock dumclk3) of the dummy circuit (FIG. 2), and in accordance with the result of this comparison, supplies the up/down signal UP/DOWN to the up/down counter 42 in the delay element control circuit unit 4.

More specifically, in the case in which the phase of the first input clock clkz is delayed behind the phase of the output signal of the dummy circuit 6, the up/down signal UP/DOWN is set to "H" level thereby to increase the delay amount of each of the first delay element circuit unit 3a and the second delay element circuit unit 3b. In the case in which the first input clock clkz is advanced from the phase of the output signal of the dummy circuit 6, on the other hand, the up/down signal UP/DOWN is set to "L" level thereby to reduce the delay amount of each of the first delay element circuit unit 3a and the second delay element circuit unit 3b. This process is repeated until the phase of the first input clock clkz comes to coincide with the phase of the output signal of the dummy circuit 6.

Figure 5:
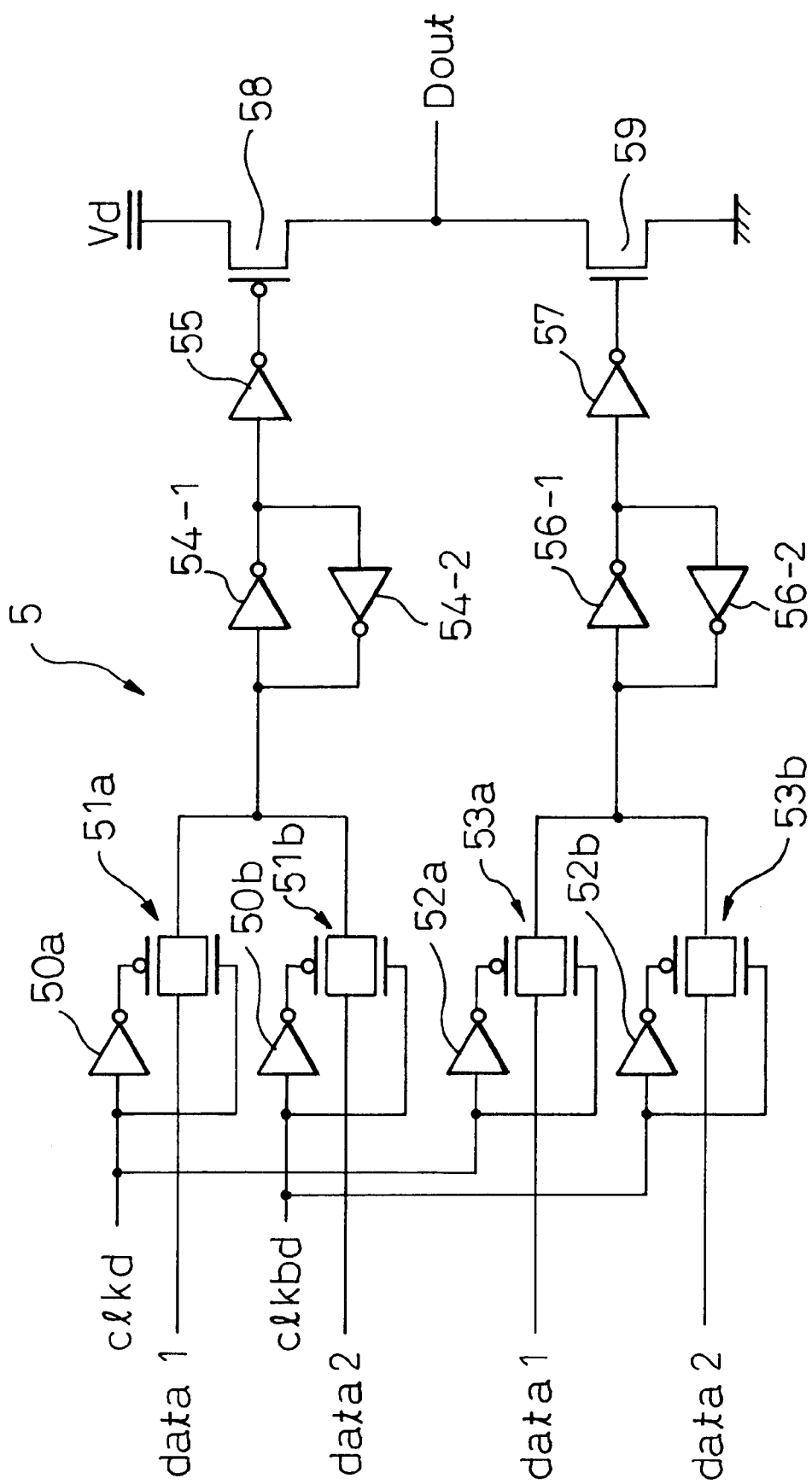
FIG. 5 is a circuit diagram showing a concrete configuration of an output circuit unit according to the embodiment of FIG. 2.

FIG. 5 is a circuit diagram showing a concrete configuration of the output circuit unit according to the embodiment of FIG. 2. With reference to FIG. 5, an explanation will be given of a concrete configuration and operation of the output circuit unit 5 for retrieving the data DATA including two types of data, data1 and data2 within each period of the clock in synchronism with the leading edge of the two internal clocks clkd, clkbd in opposite phases.

The output circuit unit 5 shown in FIG. 5 includes transfer switches 51a, 53a for carrying out the switching operation for determining whether or not the data1 is allowed to pass, based on the first internal clock clkd. On the other hand, the output circuit unit 5 includes transfer switches 51b, 53b for carrying out the switching operation for determining whether or not the data2 is allowed to pass, based on the second internal clock clkd. Each of these four transfer switches 51a, 51b, 53a and 53b is constituted by a pMOS transistor and an nMOS transistor connected in parallel with each other.

In this case, the first internal clock clkd is supplied directly to the nMOS transistor of each of the transfer switches 51a, 53a on the one hand and to the pMOS transistor of each of the transfer switches 51a, 53a through invertors 50a, 52a, respectively, on the other hand. Also, the first internal clock clkbd is supplied directly to the nMOS transistor of each of the transfer switches 51b, 53b on the one hand and supplied to the pMOS transistor of each of the transfer switches 51b, 53b through the invertors 50b, 52b, respectively.

In the transfer switches 51a, 53a having the configuration described above, the transfer switches are opened (turn on) and the data1 passes when the first internal clock clkd rises so that the pMOS transistor and the nMOS transistor in the transfer switches turn on. Further, the transfer switches are closed (turn off) and the passage of data1 is suppressed when the first internal clock clkd falls so that the pMOS transistor and the nMOS transistor of the transfer switches are turned off.

On the other hand, the transfer switches 51b, 53b having the configuration described above are opened and allow the data2 to pass when the second internal clock clkbd rises to such an extent that the pMOS transistor and the nMOS transistor in the transfer switches turn on. Further, the transfer switches 51b, 53b are closed and suppress the passage of the data2 when the second internal clock clkbd falls to such an extent that the pMOS transistor and the nMOS transistor in the transfer switches turn off.

Further, the output circuit unit 5 shown in FIG. 5 includes a first latch circuit connected to a common terminal of the two transfer switches 51a, 51b and holding the two types of data including data1, data2 sent from the transfer switches 51a, 51b. This first latch circuit includes two invertors 54-1, 54-2. The input terminal of the invertor 54-1 is connected to the output terminal of the invertor 54-2, and the output terminal of the invertor 54-1 is connected to the input terminal of the invertor 54-2. Furthermore, the output circuit unit 5 of FIG. 4 includes an invertor 55 with the input portion thereof connected to the output portion of the first latch circuit and a pMOS transistor 58 in the last stage with the gate thereof connected to the output portion of the invertor 55.

Also, the output circuit unit 5 of FIG. 5 includes a second latch circuit connected to a common output terminal of the two transfer switches 53a, 53b, and holding the two types of data, data1 and data2, sent out from the transfer switches 53a, 53b. The second latch circuit has two invertors 56-1, 56-2. The input terminal of the invertor 56-1 is connected to the output terminal of the invertor 56-2, and the output terminal of the invertor 56-1 is connected to the input terminal of the invertor 56-2. In addition, the output circuit unit 5 of FIG. 5 includes an invertor 57 with the input portion thereof connected to the output portion of the second latch circuit and an nMOS transistor 59 in the last stage with the gate thereof connected to the output portion of the invertor 57.

As shown in FIG. 5, the source of the pMOS transistor 58 in the last stage is connected to a high-voltage power supply of the source voltage Vd, and the source of the nMOS transistor 59 in the last stage is connected to a low-voltage power supply of the ground potential or the like. Further, the drain of the pMOS transistor 58 is connected to the drain of the nMOS transistor 59, and the two types of data, data1 and data2, are output as an output signal Dout (output data DQ) from the connecting point of the pMOS transistor and the nMOS transistor.

In the output circuit unit 5 of FIG. 5, the rise and fall of the first internal clock clkd occurs at the same time as the rise and fall of the second internal clock clkbd. During the rise and fall of the first and second clocks clkd, clkbd, therefore, there is a period of time during which both the transfer switches 51a, 51b are closed at the same time. In such a condition, the data which is to be sent out from the transfer switches is not determined, and therefore a current flows through the pMOS transistor and the nMOS transistor constituting a CMOS transistor circuit (not shown) in the invertor 55, thereby increasing the current consumption. In order to avoid this disadvantage, a first latch circuit is provided whereby "H" or "L" level of the data can be determined even in the case in which the two transfer switches 51a, 51b are closed at the same time for a moment.

For the same reason, there is a moment of time when both the transfer switches 53a, 53b are closed at the same time. In this condition, the data which is to be sent out from the transfer switch is not determined, and therefore, a current flows between the pMOS transistor and the nMOS transistor constituting a CMOS transistor circuit (not shown) in the invertor 57, thereby increasing the current consumption. In order to avoid this disadvantage, a second latch circuit is provided whereby "H" or "L" level of the data can be determined even in the case in which the two transfer switches 53a, 53b are closed at the same time for a moment.

The data (data1 or data2) held in the first latch circuit described above is input to the pMOS transistor 58 through the invertor 55. On the other hand, the data (data1 or data2) held in the second latch circuit is input to the nMOS transistor 59 through the invertor 57. In accordance with the output level of these invertors 55, 57, the pMOS transistor 58 or the nMOS transistor 59 in the last stage turns on, so that the output signal Dout of "H" or "L" level is finally output. In other words, the two data, data1 and data2, are output in synchronism with the timing of the rise of each of the two internal clocks clkd, clkbd.

Figure 6:
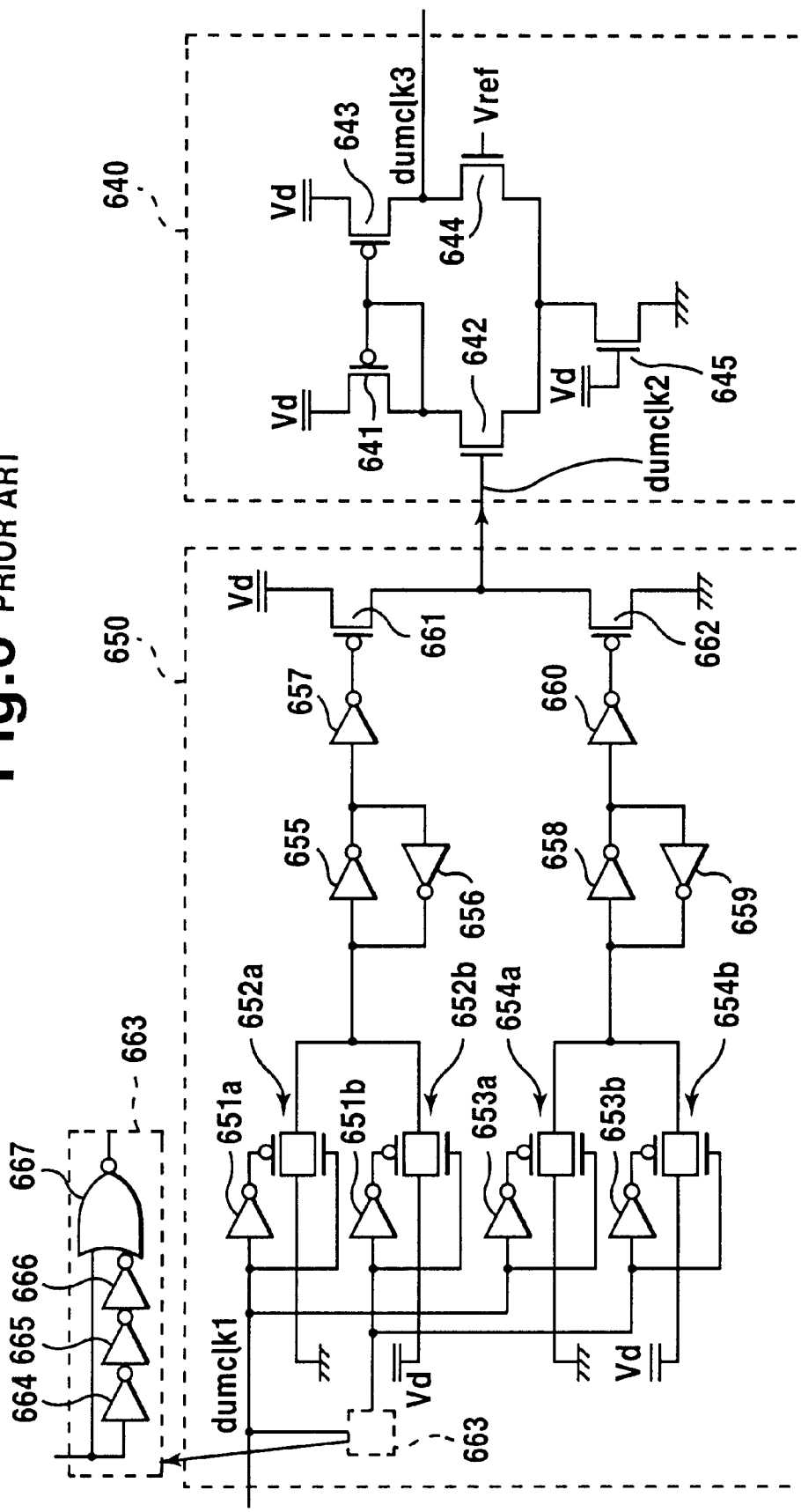
FIG. 6 is a circuit diagram showing a concrete configuration of a dummy circuit according to the related art.
Figure 7:
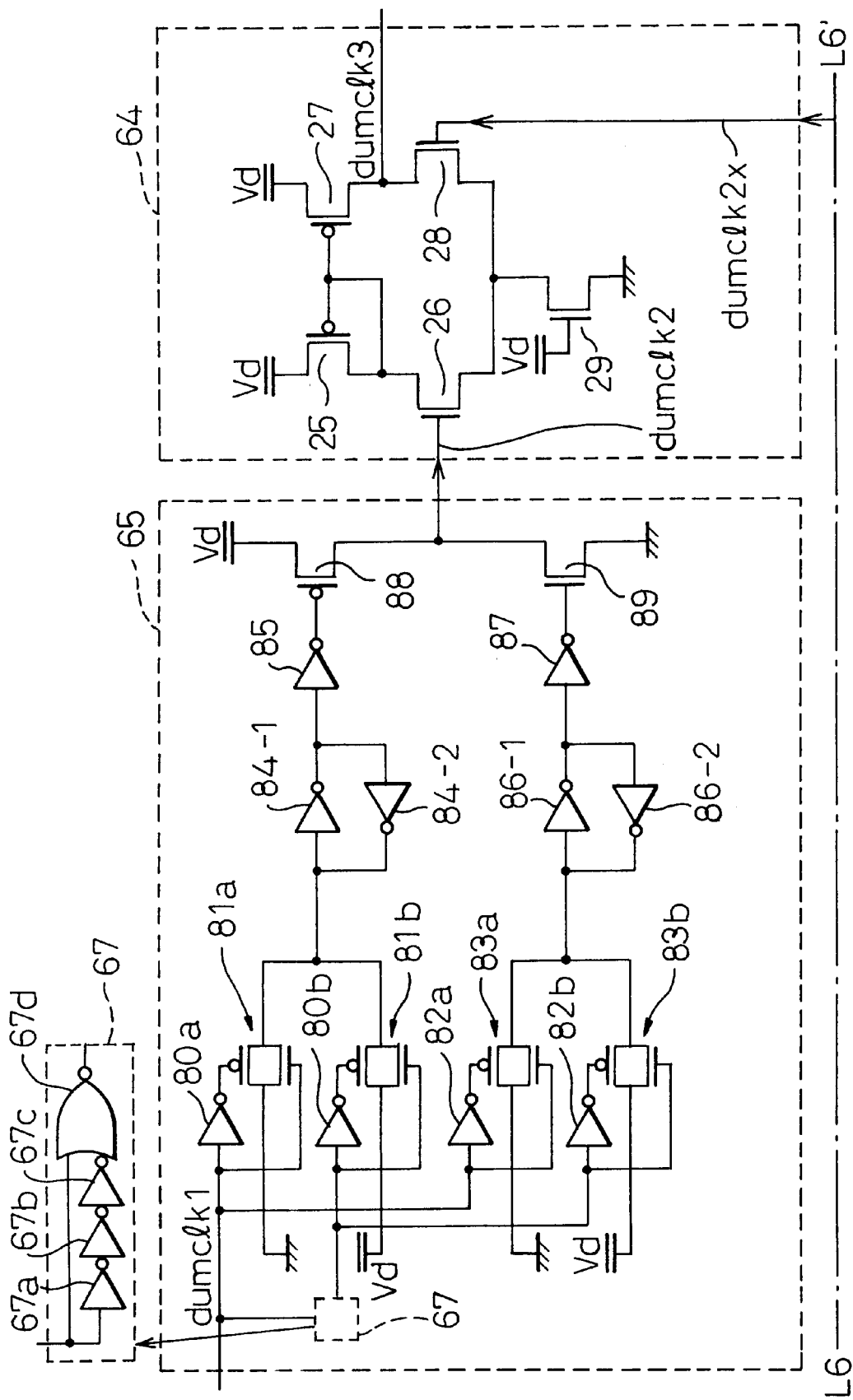
FIG. 7 is a first part of a diagram showing a concrete configuration of a dummy circuit according to the embodiment of FIG. 2.
Figure 8:
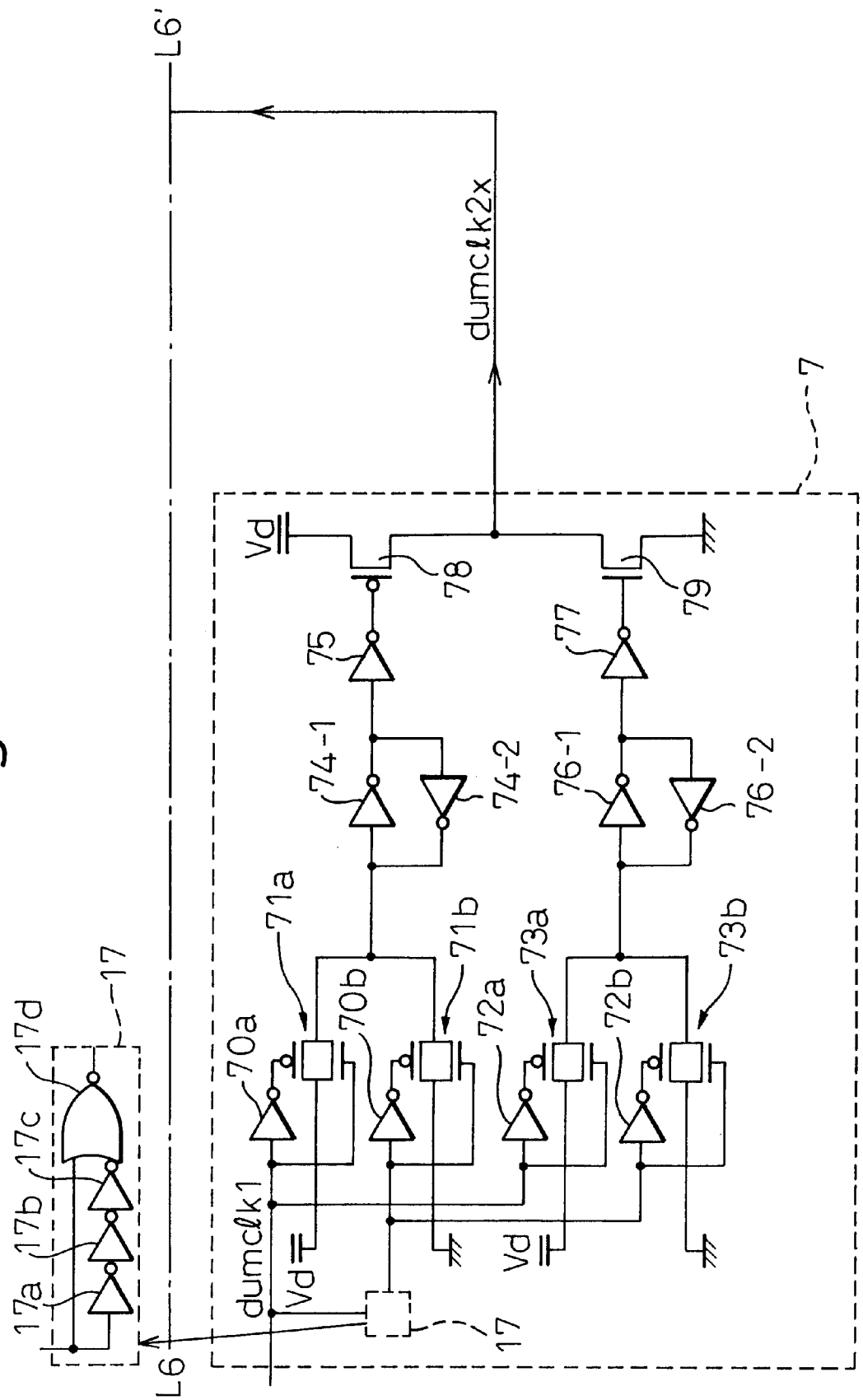
FIG. 8 is a second part of the diagram showing a concrete configuration of the dummy circuit according to the embodiment of FIG. 2.

FIG. 6 is a circuit diagram showing a concrete configuration of a dummy circuit according to the related art. FIGS. 7 and 8 are a first part and a second part, respectively, of the diagram showing a concrete configuration of the dummy circuit according to the embodiment of FIG. 2. Now, the configuration constituting the feature of the dummy circuit according to this embodiment will be explained, by comparing a dummy circuit according to the related art with a dummy circuit according to a preferred embodiment (FIG. 2) of the present invention.

The dummy output circuit unit 650 according to the related art shown in FIG. 6 has substantially the same configuration as the output circuit unit 5 shown in FIG. 5 in order to monitor the passage of the first and second internal clocks in the output circuit unit of the real circuit. In the phase comparing unit 9 (FIG. 2) in the real circuit, the rise of the reference clock refclk is compared with the rise of the output signal (dummy clock dumclk3) passing through the dummy circuit. It is therefore necessary to monitor the rise of the dummy clock dumclk1 input to the dummy output circuit unit 650. Thus, the dummy clock dumclk2 is output as an "H" level signal from the dummy output circuit unit 650 at the timing of the rise of the dummy clock dumclk1 supplied from the dummy delay element circuit unit 650.

In this condition, the dummy clock dumclk2 remains at "H" level and would fail to return to "L" level. To prevent such a disadvantage, the transfer switch 652b and the transfer switch 654b are opened by generating a "H" level pulse from the pulse generating circuit 663 including a plurality (three, in this case) of invertors 664, 665 and 666 by utilizing the timing of the fall of the dummy clock dumclk1. The data is required to be determined in advance to secure the "L" level of the dummy clock dumclk2 in this way.

In this case, the portions corresponding to the two types of data, data1 and data2, input to the output circuit in the real circuit are set to the ground potential and the source voltage Vd, respectively, so that data1 is kept at "L" level and data2 at "H" level.

More specifically, the dummy output circuit unit 650 shown in FIG. 6 includes transfer switches 652a, 652b, 654a and 654b for carrying out the switching operation based on the dummy clock dumclk1. Each of these four transfer switches 652a, 652b, 654a and 654b is constituted by a pMOS transistor and an nMOS transistor connected in parallel with each other. In this case, the dummy clock dumclk1 is supplied to the nMOS transistor of each of the transfer switches 652a, 652b, 654a and 654b without the intermediary of the invertor, while at the same time being supplied through the invertors 651a, 651b, 653a and 653b to each pMOS transistor in the transfer switches.

The transfer switches 652a, 654a having this configuration are opened (turn on) and allow the signal of "L" level (data1) to pass when the dummy clock dumclk1 rises and the pMOS transistor and the nMOS transistor in the transfer switches turn on. Further, the transfer switches 652a, 654a are closed (turn off) and suppress the passage of the signal of "L" level when the dummy clock dumclk1 falls and the pMOS transistor and the nMOS transistor in the transfer switches turn off.

On the other hand, the transfer switches 652b, 654b having this configuration are opened (turn on) and allow the signal of "H" level (data2) to pass when the dummy clock dumclk1 rises and the pMOS transistor and the nMOS transistor in the transfer switches turn on. Further, the transfer switches 652b, 654b are closed (turn off) and suppress the passage of the signal of "H" level when the dummy clock dumclk1 falls and the pMOS transistor and the nMOS transistor in the transfer switches turn off.

Further, the dummy output circuit unit 650 shown in FIG. 6 includes a first latch circuit connected to an output terminal shared by the two transfer switches 652a, 652b for holding the signal (data1, data2) sent out from the transfer switches 652a, 652b. This first latch circuit is configured with two invertors 655, 656. Furthermore, the dummy output circuit unit 650 shown in FIG. 6 includes an invertor 657 with the input portion thereof connected to the output portion of the first latch circuit and a pMOS transistor 661 in the last stage with the gate thereof connected to the output portion of the invertor 657.

On the other hand, the dummy output circuit unit 650 shown in FIG. 6 includes a second latch circuit connected to an output terminal shared by the two transfer switches 654a, 654b for holding the signal (data1, data2) sent out from the transfer switches 654a, 654b. This second latch circuit is configured with two invertors 658, 659. Furthermore, the dummy output circuit unit 650 shown in FIG. 6 includes an invertor 660 with the input portion thereof connected to the output portion of the second latch circuit and an nMOS transistor 662 in the last stage with the gate thereof connected to the output portion of the invertor 660.

As shown in FIG. 6, the source of the pMOS transistor 661 in the last stage is connected to a high-voltage power supply of the voltage source Vd, while the source of the pMOS transistor in the last stage is connected to a low-voltage power supply of the ground potential or the like. Further, the drain of the pMOS transistor 661 is connected to the drain of the nMOS transistor 662, so that the dummy clock dumclk2 to be supplied to the dummy input circuit unit 640 is output from the connecting point of the pMOS transistor and the nMOS transistor.

In controlling the transfer switches 652b, 654b holding the data2 at "H" level, the dummy clock dumclk1 is supplied to the pMOS transistor of the transfer switches through the invertors 651b, 653b, respectively. Therefore, there is a period of time during which both the pMOS transistor and the nMOS transistor in the transfer switches are opened. For this reason, the dummy clock dumclk2 is controlled to "L" level by generating an "H" level signal (pulse) from the pulse generating circuit unit 663 by utilizing the timing of the fall of the dummy clock dumclk1.

Further, the dummy input circuit unit 640 according to the related art shown in FIG. 6 has substantially the same circuit configuration as the input first stage circuit unit 2a shown in FIG. 3A in order to monitor the passage of the external clock in the input circuit unit of the real circuit, As described in "DESCRIPTION OF THE RELATED ART", however, only one dummy clock dumclk2 is supplied to one of the input portions of the dummy input circuit unit 640. Therefore, by supplying the reference signal Vref of DC level to the remaining one of the input portions of the dummy input circuit portion 640, a configuration is realized which is substantially identical to the input circuit unit supplied with two external clocks in a complementary clock form.

More specifically, the dummy input circuit unit 640 in FIG. 6 includes a pair of nMOS transistors 642, 644 functioning as a differential amplifier, an nMOS transistor 645 functioning as a current source for the circuit as a whole, a pair of pMOS transistors 641, 643 (these transistors constitute a current mirror circuit) connected in a current mirror circuit form for regulating the current flowing in the nMOS transistor 644 included in the nMOS transistor pair 642, 644. Further, the source of each of the pMOS transistors 641, 643 constituting a current mirror circuit is connected to the high-voltage power supply of the source voltage Vd. The drains of the nMOS transistors 641, 643 are connected to the drains of the nMOS transistors 642, 644, respectively. Further, the sources of a pair of nMOS transistors 642, 644 are connected to the drain of the nMOS transistor 645 of the current source. On the other hand, the source of the nMOS transistor 645 is connected to a low-voltage power supply of the ground potential or the like.

In the dummy input circuit unit 640 shown in FIG. 6, the dummy clock dumclk2 is input to the gate of the nMOS transistor 642 included in the nMOS transistor pair 642, 644, while the reference signal Vref of DC level is input to the gate of the nMOS transistor 644. Further, the dummy clock dumclk3, having a predetermined phase delayed behind the dummy clock dumclk1, is output from the drain of the nMOS transistor 644.

Now, a concrete circuit configuration of the dummy output circuit unit 65, the dummy input circuit unit 64 and the opposite phase signal generating circuit 7 constituting the essential parts of the dummy circuit according to this embodiment will be explained with reference to FIGS. 7 and 8.

The dummy output circuit unit 65 according to this embodiment shown in FIG. 7 has substantially the same circuit configuration as the output circuit unit 5 shown in FIG. 5 (or the dummy output circuit unit 650 shown in FIG. 6) in order to monitor the passage of the first and second internal clocks of the output circuit unit. In the phase comparing unit 9 (FIG. 2) in the real circuit, the leading edge of the reference clock refclk is compared with the leading edge of the output signal (dummy clock dumclk3) passing through the dummy circuit, and therefore, the rise of the dummy clock dumclk1 input to the dummy output circuit unit 65 is required to be monitored. Thus, the dummy clock dumclk2 from the dummy output circuit unit 65 is output as an "H" level signal at the timing of the rise of the dummy clock dumclk1 supplied from the dummy delay element circuit unit 63. In this condition, however, the dummy clock dumclk2 remains at "H" level and fails to return to "L" level. To avoid this disadvantage, an "H" level pulse is generated by a pulse generating circuit 67 including a plurality (three, in this case) of invertors 67a, 67b, 67c in series and a NOR gate 67d by utilizing the timing of the fall of the dummy clock dumclk1, and this "H" level pulse is used to open the transfer switch 81b and the transfer switch 83b. The data is required to be determined in advance in order to secure the dummy clock dumclk2 of "L" level in this way.

According to this embodiment, the portions corresponding to the two types of data including data1 and data2 input to the output circuit in the real circuit are maintained at the ground potential and the source voltage Vd, respectively, thereby to maintain data1 at "L" level and data2 at "H" level.

More specifically, the dummy output circuit unit 65 shown in FIG. 7 includes transfer switches 81a, 81b, 83a and 83b for carrying out the switching operation based on the dummy clock dumclk1. Each of these four transfer switches 81a, 81b, 83a and 83b is constituted by a pMOS transistor and an nMOS transistor connected in parallel with each other. In this case, the dummy clock dumclk1 is supplied to the nMOS transistor of each of the transfer switches 81a, 81b, 83a and 83b without the intermediary of an invertor on the one hand and supplied to each pMOS transistor in the transfer switches through the invertors 80a, 80b, 82a and 82b, respectively, on the other hand. The transfer switches 81a, 81b, 83a and 83b have substantially the same function as the transfer switches 652a, 652b, 654a and 654b, respectively, of the dummy output circuit unit according to the related art.

The transfer switches 81a, 83a having the aforementioned configuration are opened and allow an "L" level signal (data 1) to pass when the dummy clock dumclk1 rises and the pMOS transistor and the nMOS transistor in the transfer switches turn on. Further, The transfer switches 81a, 83a are closed and suppress the passage of an "L" level signal when the dummy clock dumclk1 falls and the pMOS transistor and the nMOS transistor in the transfer switches turn off.

On the other hand, the transfer switches 81b, 83b having the aforementioned configuration are opened and allow an "H" level signal (data 2) to pass when the dummy clock dumclk1 rises and the pMOS transistor and the nMOS transistor in the transfer switches turn on. Further, the transfer switches 81b, 83b are closed and suppress the passage of an "H" level signal when the dummy clock dumclk1 falls and the pMOS transistor and the nMOS transistor in the transfer switches turn off.

Further, the dummy output circuit unit 65 shown in FIG. 7 includes a first latch circuit connected to a common output terminal of the two transfer switches 81a, 83a for holding the signal (data1, data2) sent out from the transfer switches 81a, 83a. The first latch circuit is configured with two invertors 84-1, 84-2. Further, the dummy output circuit unit 65 of FIG. 7 includes an invertor 85 with the input portion thereof connected to the output portion of the first latch circuit and a pMOS transistor 88 in the last stage with the gate thereof connected to the output portion of the invertor 85.

On the other hand, the dummy output circuit unit 65 shown in FIG. 7 includes a second latch circuit connected to a common output terminal of the two transfer switches 81b, 83b for holding the signal (data1, data2) sent out from the transfer switches 81b, 83b. The second latch circuit is configured with two invertors 86-1, 86-2. Further, the dummy output circuit unit 65 of FIG. 7 includes an invertor 87 with the input portion thereof connected to the output portion of the second latch circuit and an nMOS transistor 89 in the last stage with the gate thereof connected to the output portion of the invertor 87.

As shown in FIG. 7, the source of the pMOS transistor in the last stage is connected to a high-voltage power supply of the source voltage Vd, and the source of the nMOS transistor 88 in the last stage is connected to a low-voltage power supply of the ground potential or the like. Further, the drain of the pMOS transistor 88 is connected to the drain of the nMOS transistor 89, so that the dummy clock dumclk2 to be supplied to the dummy input circuit unit 64 is output from the connecting point of the pMOS transistor and the nMOS transistor. The first latch circuit, the second latch circuit, the invertors 85, 87, the pMOS transistor 88 and the nMOS transistor 89 described above have substantially the same function as the first latch circuit, the second latch circuit, the invertors 657, 660, the pMOS transistor 661 and the nMOS transistor 662, respectively, of the dummy output circuit unit according to the related art.

In controlling the transfer switches 81b, 83b in the portion in which data2 is maintained at "H" level, the dummy clock dumclk1 is supplied through the invertors 80b, 82b to the pMOS transistor of the transfer switches, and therefore, there is a period of time during which both the pMOS transistor and the nMOS transistor in the transfer switches are opened. Therefore, the dummy clock dumclk2 is controlled to "L" level by generating an "H" level signal by the pulse generating circuit unit 67 by utilizing the timing of the fall of the dummy clock dumclk1.

The dummy input circuit unit 64 according to this embodiment shown in FIG. 7 has substantially the same circuit configuration as the input first stage circuit unit 2a shown in FIG. 3(A) in order to monitor the passage of the external clock in the input circuit unit of the real circuit. In this case, unlike the dummy input circuit unit 640 according to the related art (FIG. 6), the dummy clock dumclk2 is applied to one of the input portions, while the opposite phase dummy clock dumclk2x in an opposite phase to the dummy clock dumclk2 is supplied to the other input unit. As a result, the configuration of the dummy input circuit unit becomes more similar to the configuration of the input circuit unit. Therefore, an error concerning the monitor time of the dummy circuit as a whole can be reduced as compared with when using the reference signal Vref of DC level as in the related art.

More specifically, the dummy input circuit unit 64 shown in FIG. 7 includes a pair of nMOS transistors 26, 28 functioning as a differential amplifier, an nMOS transistor functioning as a current source for the whole circuit, and a pair of pMOS transistors 25, 27 (these transistors constitute a current mirror circuit) connected in a current mirror circuit form for regulating the current flowing in the nMOS transistor 26 included in the nMOS transistor pair 26, 28. Further, the source of each of the pMOS transistors 25, 27 constituting the current mirror circuit is connected to the high-voltage power supply of the source voltage Vd, and the drains of the pMOS transistors 25, 27 are connected to the drains of the nMOS transistors 26, 28, respectively. Further, the source of each of the nMOS transistors 26, 28 is connected to the drain of the nMOS transistor 29 constituting a current source. The source of the nMOS transistor 29, on the other hand, is connected to the low-voltage power supply of the ground potential or the like.

In the dummy input circuit unit 64 shown in FIG. 7, the dummy clock dumclk2 supplied from the dummy output circuit unit 65 is input to the gate of the nMOS transistor 26 paired with the nMOS transistor 28, while the opposite phase dummy clock dumclk2x supplied from the opposite phase signal generating unit 7 is input to the gate of the nMOS transistor 28. Further, the dummy clock dumclk3 having a predetermined phase delay behind the dummy clock dumclk1 is output from the drain of the nMOS transistor 28.

The opposite phase signal generating unit 7 shown in FIG. 8, on the other hand, is supplied with a signal branching from the dummy clock dumclk1. This opposite phase signal generating unit 7 has substantially the same configuration as the dummy output circuit unit 65 of FIG. 7 described above. The opposite phase signal generating unit 7, however, is required to output a signal in an opposite phase to the dummy clock dumclk2 (opposite phase dummy clock dumclk2x), and therefore, unlike the dummy output circuit unit 65 of FIG. 7 described, data1 is maintained at "H" level and data2 at "L" level.

The opposite phase dummy clock dumclk2x output from the opposite phase signal generating unit 7 of FIG. 8 is output as an "L" level signal at the leading edge of the dummy clock dumclk1 supplied from the dummy delay element circuit unit 63. In this condition, the dummy clock dumclk2 remains at "L" level and would fail to return to "H" level. In order to avoid this disadvantage, an "H" level pulse is generated by a pulse generating circuit unit 17 including a plurality of (three, in this case) invertors 17a, 17b, 17c and a NOR gate 17d in series utilizing the trailing edge of the dummy clock dumclk1, and this "H" level pulse is used to open the transfer switches 71b and 73b. It is thus necessary to predetermine such data as to secure the "H" level of the dummy clock dumclk2.

In this case, unlike the dummy output circuit unit 65 described above, the portions corresponding to two types of data, i.e., data1 and data2 are maintained at the source voltage Vd and the ground, respectively, so that data1 is kept at "H" level and data2 is kept at "L" level.

More specifically, the opposite phase signal generating unit 7 shown in FIG. 8 includes transfer switches 71a, 71b, 73a, 73b for performing the switching operation based on the dummy clock dumclk1. Each of the four transfer switches 71a, 71b, 73a, 73b is configured with a pMOS transistor and an nMOS transistor in parallel. In this case, the dummy clock dumclk1 is supplied to the nMOS transistor in each of the transfer switches 71a, 71b, 73a, 73b without the intermediary of the invertor on the one hand and supplied to the pMOS transistor of each of the same transfer switches through the invertors 70a, 70b, 72a, 72b, respectively, on the other hand.

The transfer switches 71a, 73a having the aforementioned configuration are opened and allow an "H" level signal (data1) to pass when the dummy clock dumclk1 rises and the pMOS transistor and the nMOS transistor in the transfer switches turn on. Further, the same transfer switches are closed and suppress the passage of the "H" level signal when the dummy clock dumclk1 falls and the pMOS transistor and the nMOS transistor in the transfer switches turn off.

On the other hand, the transfer switches 71b, 73b having the aforementioned configuration are opened and allow an "L" level signal (data2) to pass when the dummy clock dumclk1 rises and the pMOS transistor and the nMOS transistor in the transfer switches turn on. Further, the same transfer switches are closed and suppress the passage of the "L" level signal when the dummy clock dumclk1 falls and the pMOS transistor and the nMOS transistor in the transfer switches turn off.

The opposite phase signal generating unit 7 shown in FIG. 8 includes a first latch circuit connected to an output terminal shared by two transfer switches 71a, 73a, for holding the signal (data1, data2) sent out from the transfer switches 71a, 73a. The first latch circuit is configured with two invertors 74-1, 74-2. Further, the opposite phase signal generating unit 7 includes an invertor 75 with the input portion thereof connected to the output portion of the first latch circuit and a pMOS transistor 78 in the last stage with the gate thereof connected to the output portion of the invertor 75.

On the other hand, the opposite phase signal generating unit 7 shown in FIG. 8 includes a second latch circuit connected to an output terminal shared by two transfer switches 71b, 73b, for holding the signal (data1, data2) sent out from the transfer switches 71b, 73b. The second latch circuit is configured with two invertors 76-1, 76-2. Further, the opposite phase signal generating unit 7 of FIG. 8 includes an invertor 77 with the input portion thereof connected to the output portion of the second latch circuit and an nMOS transistor 79 in the last stage with the gate thereof connected to the output portion of the invertor 77.

As shown in FIG. 8, the source of the pMOS transistor 77 in the last stage is connected to the high-voltage power supply of the source voltage Vd, and the source of the nMOS transistor 77 in the last stage is connected to the low-voltage power supply of the ground potential or the like. Further, the drain of the pMOS transistor 77 is connected to the drain of the nMOS transistor 79, so that the opposite phase dummy clock dumclk2x to be supplied to the dummy input circuit unit 64 is output from the connecting point of the pMOS transistor and the nMOS transistor described above.

In the case in which the transfer switches 71b, 73b with data2 maintained at "L" level is controlled, there is a period of time during which both the pMOS transistor and the nMOS transistor in the transfer switches are opened, in view of the fact that the dummy clock dumclk1 is supplied to the pMOS transistor of the transfer switches through the invertors 70b, 72b, respectively. As a result, the dummy clock dumclk2 is controlled to "H" level by generating an "H" level signal from the pulse generating circuit unit 17 by utilizing the timing of the fall of the dummy clock dumclk1.

Figure 9:
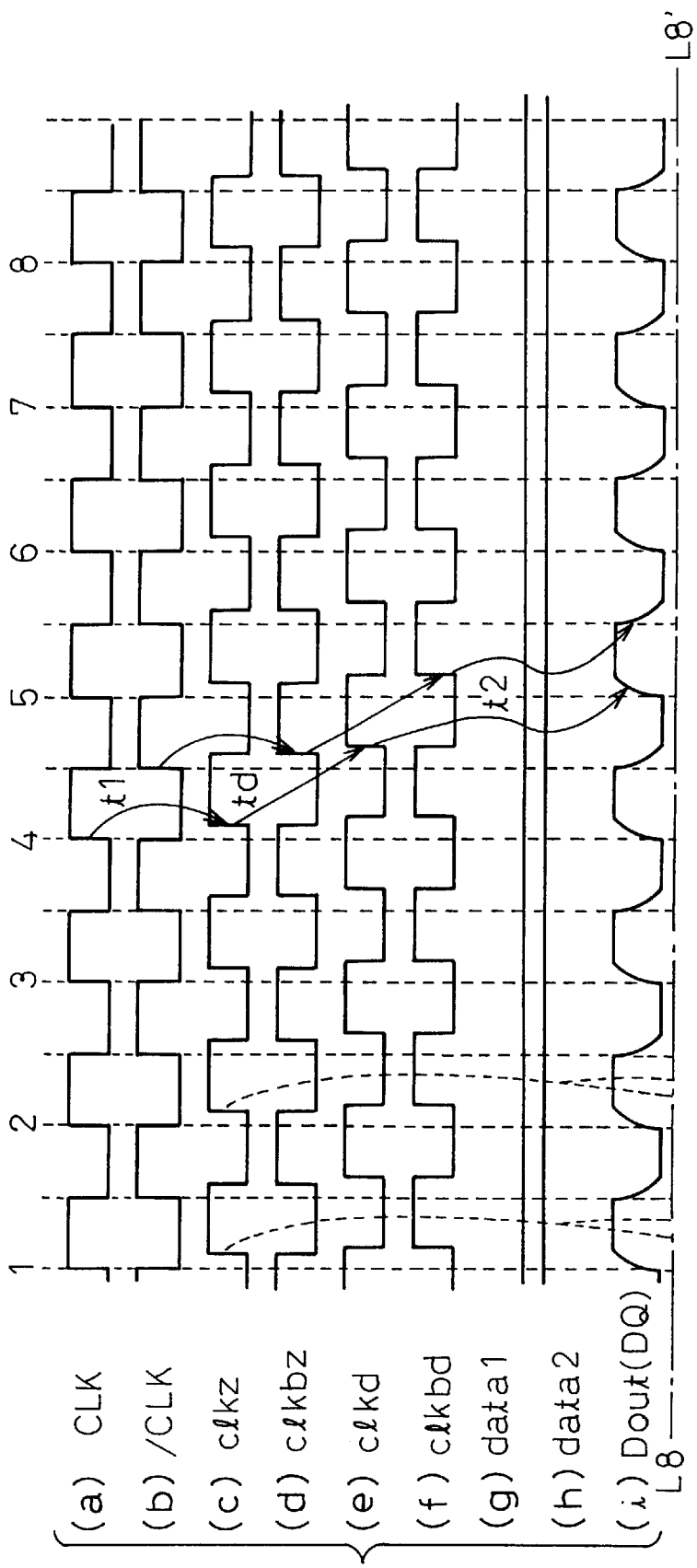
FIG. 9 is a first part of a timing chart for explaining the operation according to the embodiment of FIG. 2 and the related art.
Figure 10:
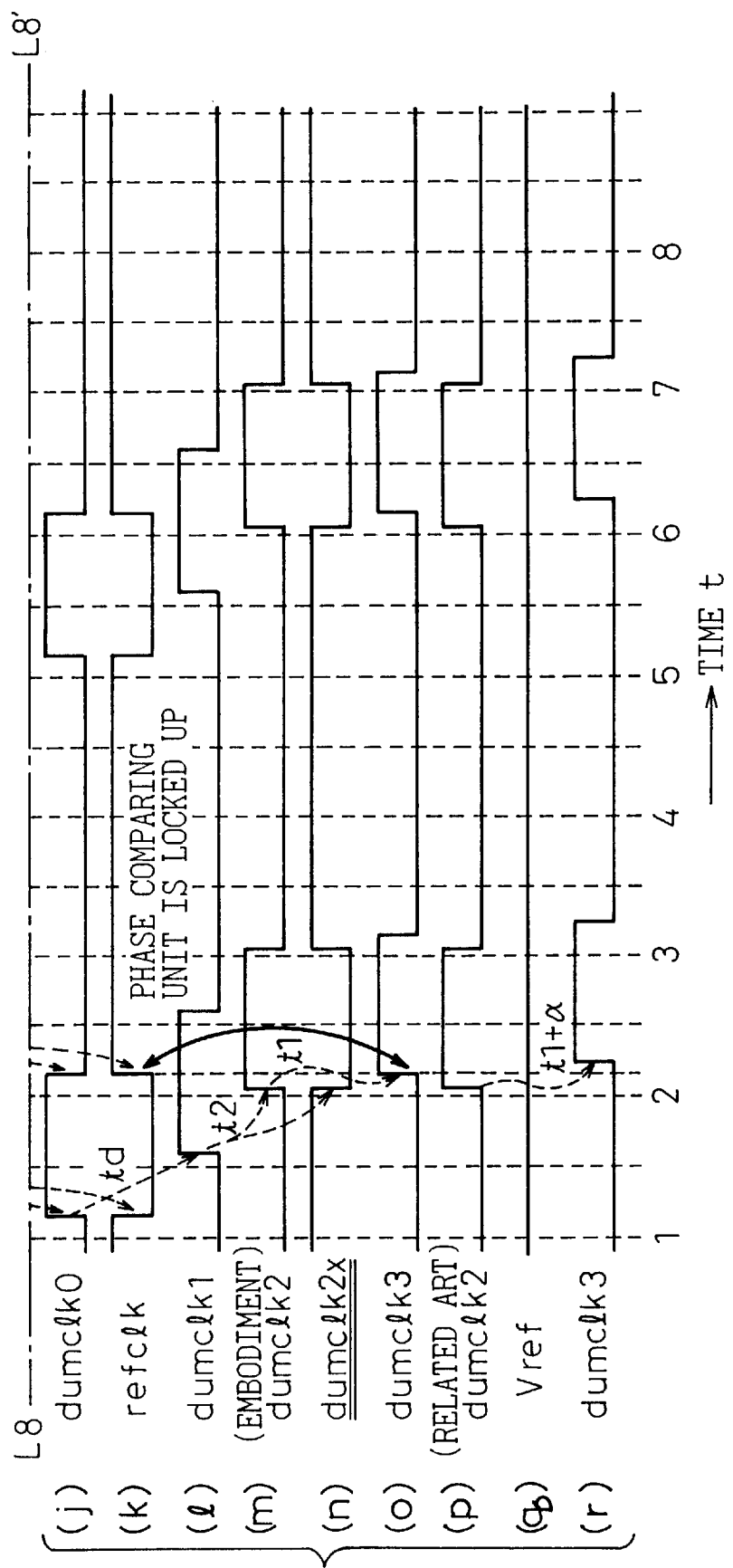
FIG. 10 is a second part of the timing chart for explaining the operation according to the embodiment of FIG. 2 and the related art.

FIGS. 9 and 10 are first and second portions of a timing chart for explaining the operation of the embodiment shown in FIG. 2 and the related art. The explanation that follows, however, refers to the change of the signal waveform at each unit with respect to time (t) on the assumption that two types of data, i.e., data1 ("L" level) and data2 ("H" level), continue to be read when the phase difference between the reference clock refclk and the dummy clock dumclk3 input to the phase comparing unit is reduced to zero and the DLL circuit is locked up.

As shown in the timing chart of FIG. 9, a first clock CLK (portion (a) of FIG. 9) and a second clock /CLK (portion (b) of FIG. 9) which is out of phase with the first clock CLK by 180° are supplied to the input circuit unit in the real circuit of the DLL circuit. A first input clock clkz and a second input clock clkbz are output from the input circuit unit with the same time delay of t1 behind the first clock CLK and the second clock /CLK, respectively, (portions (c) and (d) of FIG. 9). Further, a first internal clock clkd and a second internal clock clkbd are output from the first and second delay element circuit units with the same time delay of td behind the first input clock clkz and the second input clock clkbz, respectively (portions (d) and (e) of FIG. 9).

Furthermore, as shown in the timing chart of FIG. 9, two types of data including data1 ("L" level) and data2 ("H" level) are output from the output circuit unit as an output signal Dout (output data DQ) in synchronism with the timing of the rise of the first internal clock clkd and the second internal clock clkbd (portions (g), (h) and (i) of FIG. 9). More strictly, two types of data including data1 and data2 are output alternately during each one half period of the clock with the same delay amount t2 as the first internal clock clkd and the second internal clock clkbd.

On the other hand, as shown in FIG. 10, the input dummy clock dumclk0 having the same time delay as the first input clock clkz and the second input clock clkbz are supplied to the dummy delay element circuit unit in the dummy circuit (portion (j) of FIG. 10). At the same time, the reference clock refclk in opposite phase to the input dummy clock dumclk1 is supplied to the phase comparing unit (portion (k) of FIG. 10). Further, the dummy clock dumclk1 is output from the dummy delay element circuit unit with the time delay of td with respect to the input dummy clock dumclk0 (portion (1) of FIG. 10).

According to this embodiment, the dummy clock dumclk2 having the time delay of t2 behind the dummy clock dumclk1 is supplied to the dummy input circuit unit from the dummy output circuit unit (portion (m) of FIG. 10), while the opposite phase dummy clock dumclk2x in opposite phase to the dummy clock dumclk2 is supplied to the dummy input circuit unit from the opposite phase signal generating unit (portion (n) of FIG. 10).

According to the related art, in contrast, the dummy clock dumclk2 having the time delay of td behind the dummy clock dumclk1 is supplied from the dummy output circuit unit to the dummy input circuit unit (portion (p) of FIG. 10), while the reference voltage Vref of DC level is supplied to the dummy input circuit unit (portion (q) of FIG. 10).

In other words, according to this embodiment, the dummy clock dumclk2 and the opposite phase dummy clock dumclk2x are input as complementary clocks to the input portion of the dummy input circuit unit in the dummy circuit in the same way as they are supplied to the input portion of the input circuit unit in the real circuit. In this configuration, unlike the related art, the opposite phase signal generated in the opposite phase signal generating unit is input to the dummy input circuit unit, in place of the reference signal Vref. Thus, two dummy clocks having a complementary relationship to each other are input, and therefore, an error between the time in which the clock passes through the input circuit unit and the time in which the dummy clock passes through the dummy input circuit unit can be remarkably reduced.

According to this embodiment, therefore, the dummy clock dumclk3 is output with substantially the same delay time t1 behind the dummy clock dumclk2 as the input circuit unit (portion (o) of FIG. 10). In the related art, in contrast, the dummy clock dumclk3 is output with a longer delay time of t1+α a than the delay time of the input circuit unit behind the dummy clock dumclk2 (portion (r) of FIG. 10).

Figure 11:
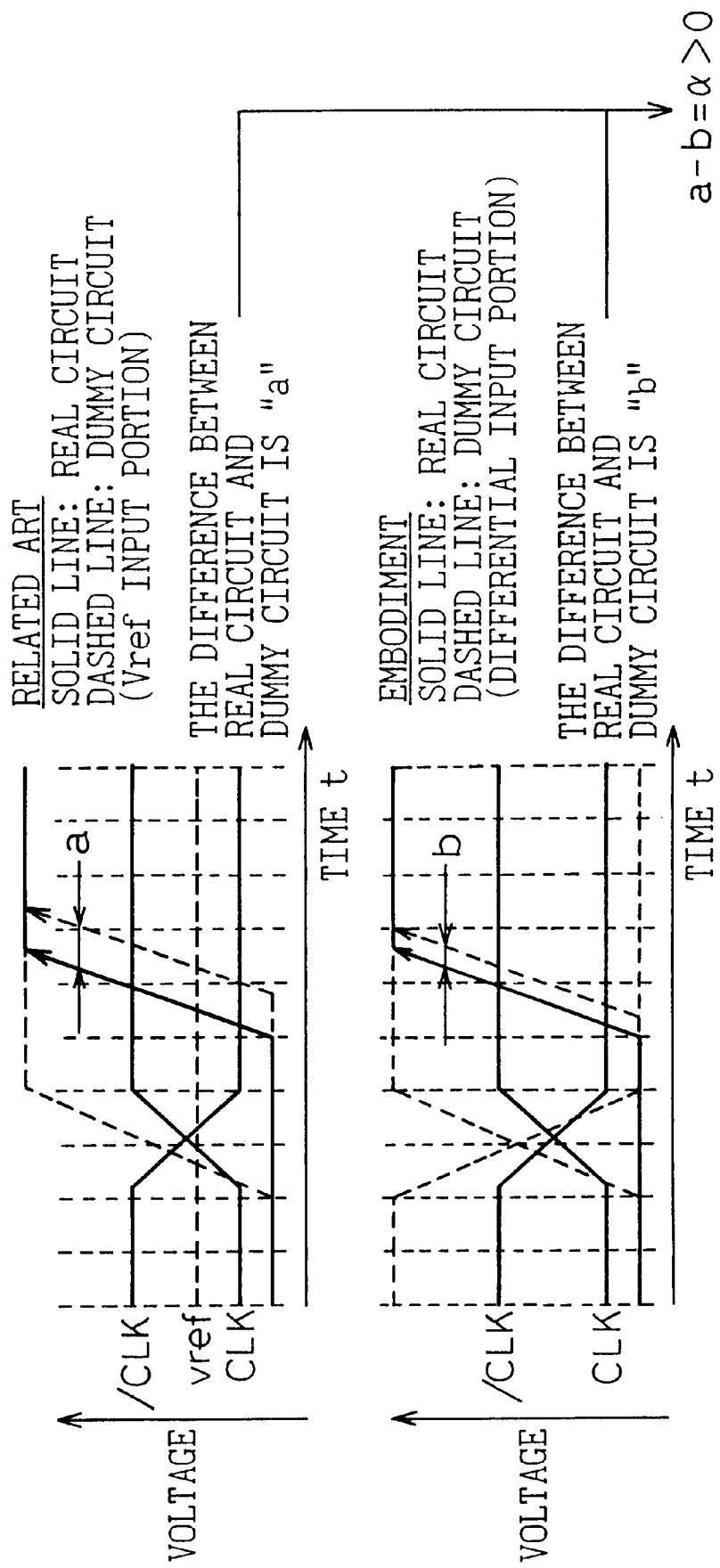
FIG. 11 is a timing chart showing the manner in which the clock passes through the DLL circuit according to the embodiment of FIG. 2 and the related art.

FIG. 11 is a timing chart showing the manner in which the clock passes through the DLL circuit according to the embodiment of FIG. 2 and the related art. The manner in which the first clock CLK and the second clock /CLK pass through the input circuit unit in the real circuit is indicated by solid line, while the manner in which the dummy clock passes through the dummy input circuit unit (i.e., the differential input portion) in the dummy circuit is indicated by dashed line.

In the related art shown in the upper part of FIG. 11, the difference is given as a between the time in which the first clock CLK passes through the input circuit unit of the real circuit and the time in which the dummy clock passes through the dummy input circuit unit of the dummy circuit. According to this embodiment shown in the lower part of FIG. 11, in contrast, the difference is given as b between the time in which the first clock CLK passes through the input circuit unit of the real circuit and the time in which the dummy clock passes through the dummy input circuit unit of the dummy circuit. The difference b is smaller by α than the difference a (a−b=α). In other words, according to this embodiment, the time required for passing through the dummy input circuit unit of the dummy circuit approaches to the time required for passing through the input circuit unit of the real circuit closer than in the related art by α (=a−b). Therefore, it becomes possible to remarkably reduce an error between the time in which the clock passes through the input circuit unit and the time in which the dummy clock passes through the dummy input circuit unit.

Figure 12:
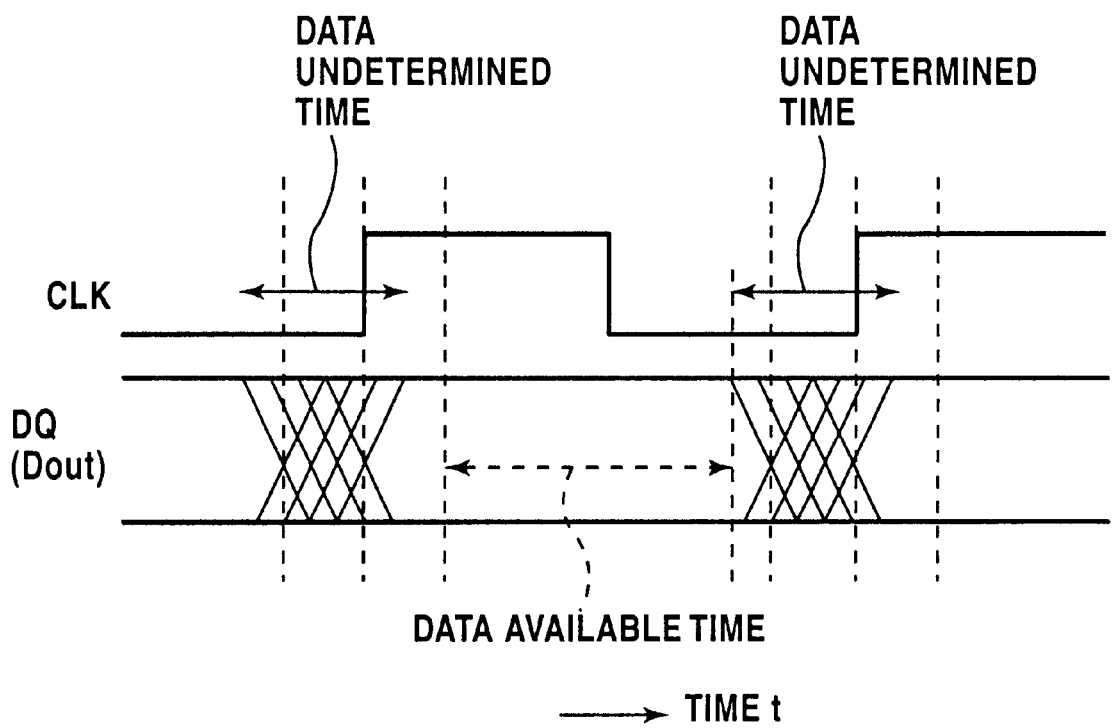
FIG. 12 is a timing chart showing the relationship between clocks and output data according to the related art.

FIG. 12 is a timing chart showing the relationship between the clock and the output data according to the related art, and FIG. 13 is a timing chart showing the relationship between the clock and the output data according to the embodiment of FIG. 2.

In the related art shown in FIG. 12, as described above, an error between the time in which the clock passes through the input circuit unit and the time in which the dummy clock passes through the dummy input circuit unit is larger than in the present embodiment by α. Thus, the data undetermined time is also shifted by α forward in phase from each of the first and second clocks CLK, /CLK. Assuming that the data undetermined time is defined as indicated by dashed line in FIG. 12, the data available time indicating a period of time in which an access to the data can be made is shifted by α, and therefore, the effective data available time is apparently reduced.

According to the present embodiment shown in FIG. 13, in contrast, an error between the time in which the clock passes through the input circuit unit and the time in which the dummy clock passes through the dummy input circuit unit is reduced by α as compared with the case of the related art, and therefore, the data undetermined time is also reduced correspondingly. As compared with the related art, therefore, the longer data available time can be secured.

In the related art, the opposite phase signal in opposite phase to the dummy clock is generated by an opposite phase signal generating unit having substantially the same configuration as the dummy output circuit unit. The present invention, however, is not confined to such a configuration. In place of the opposite phase signal generating unit described above, for example, any circuit having the function of generating an opposite phase signal exactly in an opposite phase to the dummy clock regardless of fluctuations of the ambient temperature, the source voltage, or the like may be constituted by an arbitrary transistor, an invertor, and the like.

It will thus be understood from the foregoing description that according to preferred embodiments of the present invention, a first feedback clock and a second feedback clock in an opposite phase to the first feedback clock are input to a dummy input circuit unit at the same time in the same complementary clock form as in the input first circuit unit of the stabilized timing circuit. Therefore, an error concerning the monitor time for the dummy circuit as a whole can be reduced as compared with the case in which a reference signal of DC level is used as in the related art. Further, it becomes possible to secure the longer data available time indicating time in which an access to the data can be made.

What is claimed is:

1. A semiconductor device comprising a stabilized timing circuit receiving a first clock and a second clock, complementary with each other, for generating a first internal clock and a second internal clock in a predetermined phase relationship with the first clock and the second clock, respectively, wherein the stabilized timing circuit comprises:

a clock input circuit unit including a first differential circuit for comparing voltage levels of the first clock and second clock;

a variable delay circuit unit coupled to the clock input circuit, for outputting the first internal clock, the second internal clock and a feedback clock; and a complementary feedback signal generating unit coupled to receive the feedback clock, for generating a first feedback clock and a second feedback clock, complementary with each other;

a dummy input circuit unit including a second differential circuit for comparing voltage levels of the first feedback clock and the second feedback clock; and a phase comparator coupled to the clock input circuit unit and the dummy input circuit unit for controlling the variable delay circuit unit.

2. A semiconductor device according to claim 1, wherein the complementary feedback signal generating unit further comprises:

a first dummy output circuit unit for generating the first feedback clock in response to the feedback clock; and a second dummy output circuit unit for generating the second feedback clock in response to the feedback clock.

3. A semiconductor device according to claim 1, wherein the stabilized timing circuit is configured with a delayed lock loop circuit having the function of regulating a phase of each of the first clock and the second clock, in order to output data in synchronism with leading edges of the first and second clocks.

4. A semiconductor device according to claim 1, wherein the clock input circuit unit includes a first input first stage circuit unit and a second input first stage circuit unit in which a first input clock and a second input clock complementary with each other are generated, based on the first clock and the second clock, respectively, and wherein the first internal clock and the second internal clock are generated by delaying the first input clock and the second input clock by a predetermined phase, respectively.

5. A semiconductor device according to claim 2, wherein the first feedback clock output from the first dummy output circuit unit is input to one of input terminals of the dummy input circuit unit, while the second feedback clock output from the second dummy output circuit unit is input to the remaining one of input terminals of the dummy input circuit unit.

* * * * *

UNITED STATES PATENT AND TRADEMARK OFFICE
CERTIFICATE OF CORRECTION

PATENT NO. : 6,377,100 B1
DATED : April 23, 2002
INVENTOR(S) : Waichiro Fujieda

It is certified that error appears in the above-identified patent and that said Letters Patent is hereby corrected as shown below:

<u>Title page,</u>
Item [73], please change the Assignee information to the following:
-- [73] Assignee: Fujitsu Limited, Kawasaki (JP) --

Signed and Sealed this

Seventh Day of January, 2003

JAMES E. ROGAN
*Director of the United States Patent and Trademark Office*